(12) United States Patent
Kletter

(10) Patent No.: US 11,790,559 B2
(45) Date of Patent: Oct. 17, 2023

(54) DATA COMPRESSION FOR MULTIDIMENSIONAL TIME SERIES DATA

(71) Applicant: Protein Metrics, LLC, Cupertino, CA (US)

(72) Inventor: Doron Kletter, San Mateo, CA (US)

(73) Assignee: Protein Metrics, LLC, Cupertino, CA (US)

( * ) Notice: Subject to any disclaimer, the term of this patent is extended or adjusted under 35 U.S.C. 154(b) by 0 days.

(21) Appl. No.: 17/694,474

(22) Filed: Mar. 14, 2022

(65) Prior Publication Data

US 2022/0207778 A1    Jun. 30, 2022

Related U.S. Application Data

(63) Continuation of application No. 17/462,901, filed on Aug. 31, 2021, now Pat. No. 11,276,204.

(60) Provisional application No. 63/072,890, filed on Aug. 31, 2020.

(51) Int. Cl.
| | |
|---|---|
| *H04N 19/00* | (2014.01) |
| *G06T 9/00* | (2006.01) |
| *G06F 17/15* | (2006.01) |
| *H04N 19/119* | (2014.01) |

(52) U.S. Cl.
CPC ............. *G06T 9/00* (2013.01); *G06F 17/153* (2013.01); *H04N 19/119* (2014.11); *G06T 2200/04* (2013.01)

(58) Field of Classification Search
CPC ......... G06T 9/00; H03M 7/30; H04N 19/107; H04N 19/119; H04N 19/61
See application file for complete search history.

(56) References Cited

U.S. PATENT DOCUMENTS

| | | | |
|---|---|---|---|
| 4,464,650 A | 8/1984 | Eastman et al. |
| 4,558,302 A | 12/1985 | Welch |
| 4,814,764 A | 3/1989 | Middleton |
| 5,343,554 A | 8/1994 | Koza et al. |
| 5,910,655 A | 6/1999 | Skilling |
| 5,995,989 A | 11/1999 | Gedcke et al. |
| 6,094,627 A | 7/2000 | Peck et al. |
| 6,393,393 B1 | 5/2002 | Kawahara |
| 6,535,555 B1 | 3/2003 | Bordes et al. |
| 6,798,360 B1 | 9/2004 | Qian et al. |
| 6,906,320 B2 | 6/2005 | Sachs et al. |

(Continued)

FOREIGN PATENT DOCUMENTS

WO    WO2011/127544 A1    10/2011

OTHER PUBLICATIONS

A. Khelifati, M. Khayati and P. Cudré-Mauroux, "CORAD: Correlation-Aware Compression of Massive Time Series using Sparse Dictionary Coding," 2019 IEEE International Conference on Big Data (Big Data), Los Angeles, CA, USA, 2019, pp. 2289-2298, doi: 10.1109/BigData47090.2019.9005580.*

(Continued)

*Primary Examiner* — Li Liu
(74) *Attorney, Agent, or Firm* — Shay Glenn LLP

(57) ABSTRACT

Described herein are computer-implemented methods for compressing sparse multidimensional ordered series data. In particular, these methods and apparatuses for performing them (including software) may be particularly well suited to efficiently compressing spectrographic data.

20 Claims, 7 Drawing Sheets

(56) References Cited

U.S. PATENT DOCUMENTS

| | | | |
|---|---|---|---|
| 7,006,567 | B2 | 2/2006 | Frossard et al. |
| 7,283,684 | B1 | 10/2007 | Keenan |
| 7,283,937 | B2 | 10/2007 | Goldberg |
| 7,297,940 | B2 | 11/2007 | Bern |
| 7,397,961 | B2 | 7/2008 | Keeney et al. |
| 7,400,772 | B1 | 7/2008 | Keenan |
| 7,402,438 | B2 | 7/2008 | Goldberg |
| 7,429,727 | B2 | 9/2008 | Bern |
| 7,496,453 | B2 | 2/2009 | Chau |
| 7,680,670 | B2 | 3/2010 | Lamblin et al. |
| 7,979,258 | B2 | 7/2011 | Goldberg et al. |
| 8,004,432 | B2 | 8/2011 | Kawato |
| 8,023,750 | B2 | 9/2011 | Raveendran et al. |
| 8,077,988 | B2 | 12/2011 | Donoho |
| 8,108,153 | B2 | 1/2012 | Bern |
| 8,428,889 | B2 | 4/2013 | Wright |
| 8,511,140 | B2 | 8/2013 | Gorenstein et al. |
| 8,598,516 | B2 | 12/2013 | Sapargaliyev et al. |
| 8,645,145 | B2 | 2/2014 | Subbaraman et al. |
| 9,385,751 | B2 | 7/2016 | Kletter |
| 9,571,122 | B2 | 2/2017 | Kletter |
| 9,640,376 | B1 | 5/2017 | Becker et al. |
| 9,859,917 | B2 | 1/2018 | Kletter |
| 10,199,206 | B2 | 2/2019 | Becker et al. |
| 10,354,421 | B2 | 7/2019 | Becker et al. |
| 10,510,521 | B2 | 12/2019 | Kil et al. |
| 10,546,736 | B2 | 1/2020 | Bern et al. |
| 10,665,439 | B2 | 5/2020 | Bern |
| 10,879,057 | B2 | 12/2020 | Kil et al. |
| 10,991,558 | B2 | 4/2021 | Bern et al. |
| 11,127,575 | B2 | 9/2021 | Bern |
| 11,276,204 | B1 | 3/2022 | Kletter |
| 11,289,317 | B2 | 3/2022 | Kil et al. |
| 2002/0068366 | A1 | 6/2002 | LaDine et al. |
| 2003/0031369 | A1 | 2/2003 | Le Pennec et al. |
| 2003/0200032 | A1 | 10/2003 | Keating et al. |
| 2003/0218634 | A1 | 11/2003 | Kuchinsky et al. |
| 2004/0102906 | A1 | 5/2004 | Roder |
| 2004/0160353 | A1 | 8/2004 | Cirillo et al. |
| 2005/0047670 | A1 | 3/2005 | Qian et al. |
| 2005/0063864 | A1 | 3/2005 | Sano et al. |
| 2005/0276326 | A1 | 12/2005 | Drezner |
| 2008/0010309 | A1 | 1/2008 | Sugita |
| 2008/0025394 | A1 | 1/2008 | Francois et al. |
| 2008/0260269 | A1 | 10/2008 | Thiagarajan |
| 2009/0012931 | A1 | 1/2009 | Appa et al. |
| 2009/0052528 | A1 | 2/2009 | Jeon et al. |
| 2009/0179147 | A1 | 7/2009 | Milgram et al. |
| 2010/0124785 | A1 | 5/2010 | Bern |
| 2010/0288917 | A1 | 11/2010 | Satulovsky et al. |
| 2010/0288918 | A1 | 11/2010 | Satulovsky |
| 2011/0093205 | A1 | 4/2011 | Bern |
| 2012/0047098 | A1 | 2/2012 | Reem |
| 2012/0245857 | A1 | 9/2012 | Lee et al. |
| 2013/0080073 | A1 | 3/2013 | de Corral |
| 2013/0144540 | A1 | 6/2013 | Bern et al. |
| 2013/0226594 | A1 | 8/2013 | Fuchs et al. |
| 2013/0262809 | A1 | 10/2013 | Wegener |
| 2013/0275399 | A1 | 10/2013 | Amit et al. |
| 2013/0289892 | A1 | 10/2013 | Satoh |
| 2014/0045273 | A1 | 2/2014 | Cerda et al. |
| 2014/0164444 | A1 | 6/2014 | Bowen et al. |
| 2015/0319268 | A1 | 11/2015 | Callard et al. |
| 2015/0369782 | A1 | 12/2015 | Kageyama |
| 2016/0077926 | A1 | 3/2016 | Mutalik et al. |
| 2016/0180555 | A1 | 6/2016 | Matsuo |
| 2016/0215028 | A1 | 7/2016 | Mutharia et al. |
| 2016/0268112 | A1 | 9/2016 | Yip et al. |
| 2018/0301326 | A1 | 10/2018 | Bern et al. |
| 2020/0075300 | A1 | 3/2020 | Bern |
| 2020/0413066 | A1 | 12/2020 | Lavaud |
| 2021/0048440 | A1 | 2/2021 | Nichols et al. |
| 2021/0335589 | A1 | 10/2021 | Bern et al. |
| 2022/0076936 | A1 | 3/2022 | Bern |
| 2022/0291229 | A1 | 9/2022 | Nichols et al. |
| 2022/0301840 | A1 | 9/2022 | Kil et al. |

OTHER PUBLICATIONS

Jeong et al.; Flashdeconv:ultrafast, high-quality feature deconvolution for top-down proteomics; Cell Systems; 10(2); pp. 213-218; doi.org/10.1016/j.cels.2020.01.003; 13 pages; Feb. 2020.

Marty et al.; Bayesian deconvolution of mass and ion mobility spectra: from binary interactions to polydisperse ensembles; Analutical Chemistry: 87(8); pp. 4370-4376; 7 pages; (Author Manuscript); Apr. 2015.

Marty; What can unidec do for you? Mar. 24, 2015l 28 pages; retrieved from the internet (http://unidec.chem.ox.ac.uk/UniDecTutorial.pdf) on Oct. 25, 2022.

Klammer et al.; Peptide charge state determination for low-resolution tandem mass spectra; In2005 IEEE Computational Systems Bioinformatics Conference (CSB'05); pp. 175-185; Aug. 8, 2005.

Krokhin et al.; An improved model for prediction of retention times of tryptics peptides in ion pair reversed-phase HPLC: its application to protein peptide mapping by off-line HPLC-MALDI MS; Molecular and Cellular Proteomics; 3(9); pp. 908-919; Sep. 2004.

Lu et al.; Improved peak detection and deconvolution of native electrospray mass spectra from large protein complexes; Journal of the American Society for Mass Spectrometry; 26(12); pp. 2141-2151; Dec. 2015.

Schreiber et al.; Using PeakView(TM) software with the XIC manager for screening and identification with high confidence based on high resolution and accurate mass LC-MS/MS; AB Sciex; Food & Environmental; (Pub. # 2170811-03); 5 pgs.; Apr. 2, 2011.

Shi et al.; Feature-based image set compression; 2013 IEEE International Conference on Multimedia and Expo (ICME); IEEE; pp. 1-6; Jul. 15, 2013.

Shi et al.; Multi-model prediction for image set compression; 2013 Visual Communications and Image Processing (VCIP); IEEE; pp. 1-6; Nov. 17, 2013.

Thermo Fisher Scientific, Inc.; Thermo Xcaliber: Qualitative Analysis (User Guide); Revision B; 290 pgs.; Sep. 2010.

Valot et al.; MassChroQ: A versatile tool for mass spectrometry quantification; Proteomics; 11(17); 23 pgs.; Sep. 2011.

VanBramer; An Introduction to Mass Spectrometry; Wider University; 38 pgs.; © 1997; (revised) Sep. 2, 1998.

Waters Corporation; Biopharmalynx: A new bioinformatics tool for automated LC/MS peptide mapping assignment; 6 pages retrived May 17, 2018 from the internet (http://www.waters.com/webassets/cms/library/docs/720002754en.pdf); Sep. 2008.

Waters Corporation; MassLynx 4.1 Getting started guide; 71500113203/RevisionA; 96 pages; retrieved May 17, 2018 from the internet (http://turroserver.chem.columbia.edu/group/instrument/HPLC/HPLC%20Getting%20Started.pdf) ; 2005.

Waters Corporation; QuanLynx User's Guide; Version 4.0; 125 pages; retrived May 17, 2018 from the internet ( http://www.waters.com/webassets/cms/support/docs/quanlynx_40.pdf); Feb. 15, 2002.

Wehofsky et al.; Isotopic deconvolution of matrix-assisted laser desorption/ionization mass spectra for substance-class specific analysis of complex samples; European Journal of Mass Spectrometry; 7(1); pp. 39-46; Feb. 1, 2001.

Xu et al.; Deconvolution in mass spectrometry based proteomics; Rapid Communications in Mass Spectrometry; 32(10); pp. 763-774; May 30, 2018.

Yang et al.; Detecting low level sequence variants in recombinant monoclonal antibodies; mAbs 2 (3); pp. 285-298; May/Jun. 2010.

Yang et al.; Hybrid mass spectrometry approaches in glycoprotein analysis and their usage in scoring biosimilarity; Nature Communications; 7(1); pp. 1-10; Nov. 8, 2016.

Ziv et al.; A universal algorithm for sequential data compression; IEEE Trans. on Information Theory; IT-23(3); pp. 337-343; May 1977.

(56) References Cited

OTHER PUBLICATIONS

Ziv et al.; Compression of individual sequences via variable-rate coding; IEEE Trans. on Information Theory: IT-24(5); pp. 530-536: Sep. 1978.

* cited by examiner

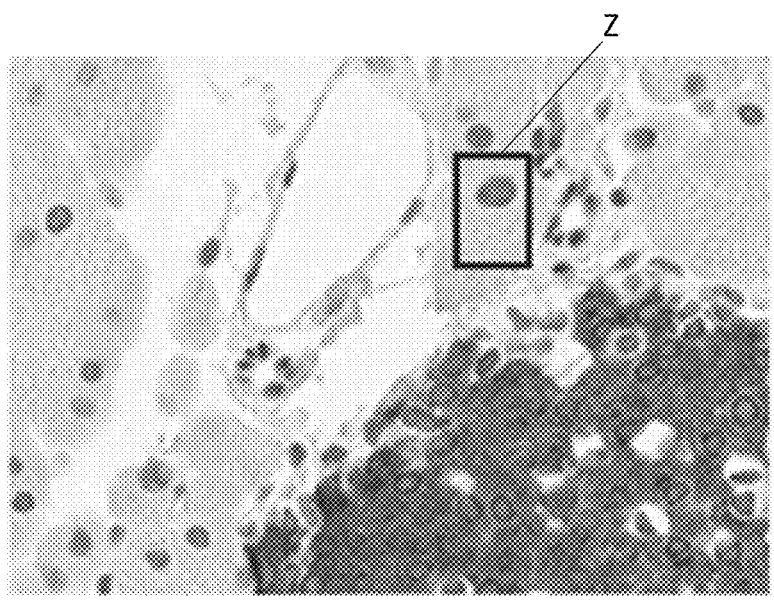
FIG. 12A
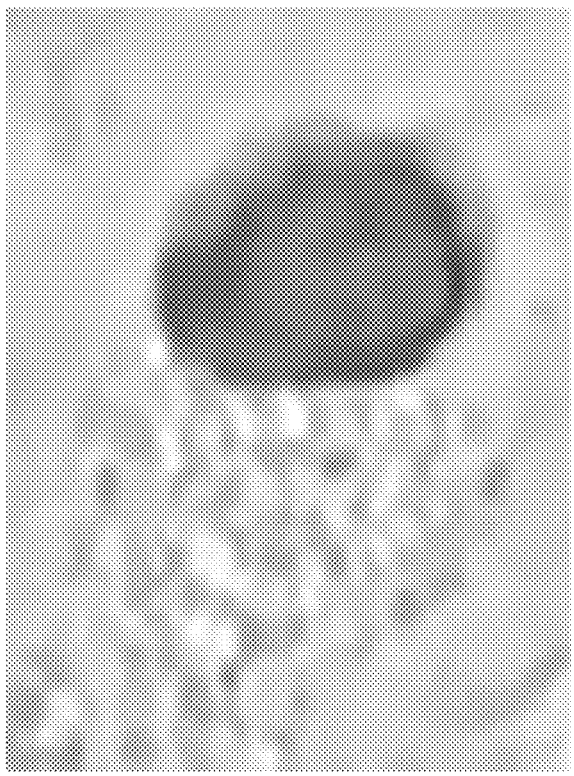 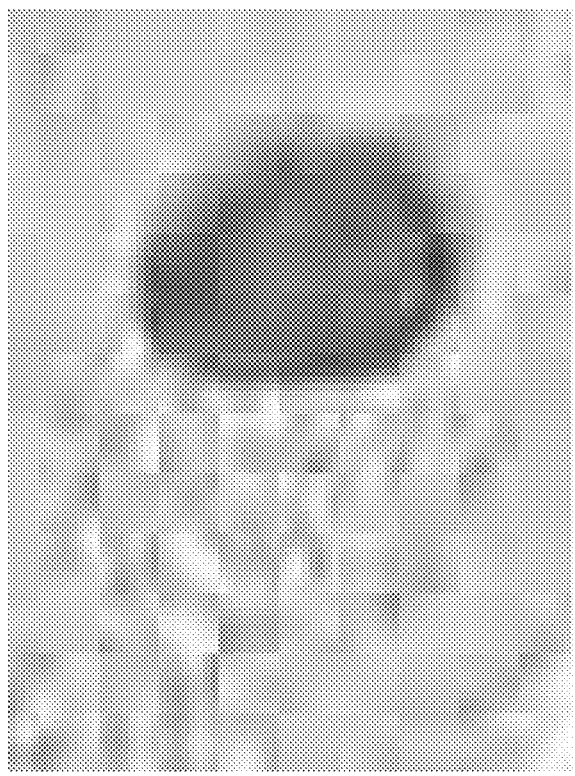
FIG. 12B  FIG. 12C

DATA COMPRESSION FOR MULTIDIMENSIONAL TIME SERIES DATA

CROSS REFERENCE TO RELATED APPLICATIONS

This patent application is a continuation of U.S. patent application Ser. No. 17/462,901 titled "DATA COMPRESSION FOR MULTIDIMENSIONAL TIME SERIES DATA," filed on Aug. 31, 2021, now U.S. Pat. No. 11,276,204, which claims priority to U.S. Provisional Patent Application No. 63/072,890, filed on Aug. 31, 2020, and titled "DATA COMPRESSION FOR MULTIDIMENSIONAL TIME SERIES DATA," which is herein incorporated by reference in its entirety.

INCORPORATION BY REFERENCE

All publications and patent applications mentioned in this specification are herein incorporated by reference in their entirety to the same extent as if each individual publication or patent application was specifically and individually indicated to be incorporated by reference.

FIELD

Described herein are systems and methods for compressing large multi-dimensional data sets, such as (but not limited to) spectroscopic data in mass spectrometry, microscopy and fluorescence microscopy, and histopathology data.

BACKGROUND

In many areas of science and engineering, such as in biology, chemistry, astronomy, physics, geology and object tracking, large quantities of spectroscopic data are often collected and stored. As technology progresses, the sensitivity and ability to capture increasingly higher levels of detail with digital microscopes and mass spectrometry sensors increases, and the amount of data that can be obtained correspondingly increases. For example, mass spectrometry analysis frequently generates, within a few hours, single data sets that may be up to 30 GB or greater in size. Using currently available instruments, $10^4$ mass spectrometry datasets with $10^6$ data points and $10^6$ mass intensity values could be easily acquired, resulting in a raw file size of 4 TB.

Similarly, a modern Bright-field microscopy instrument is capable of scanning a whole slide multiplexed image of a thin 5-micron sliver of tissue on a microscope glass and produce a full color image of up to 120,000×50,000 pixels, resulting in a raw file size of 6 GB per each tissue sliver. The tissue is removed by surgery, biopsy, or autopsy, and sliced into thin slivers, stained with one or more pigments, in order to be able to visualize the underlying cell and biological structures of interest, and differentiate from background fixatives. Microscopy images like this are routinely used in clinical medicine for disease detection and monitoring, including cancer, as well as for active disease research and identification of effective disease biomarkers.

In the field of medical imaging, an entire piece of tissue may be sliced into many thin slivers, about 1-5 micron each, where each tissue sliver is scanned using a digital microscope, and the resulting images are layered on top of each other to create a stack of images that allows the viewer to visualize and examine the entire tissue together, in 3 dimensions, instead of one sliver at a time. This technique is known as Z-stack. A single tumor, of a typical diameter 5 to 10 millimeter, may provide thousands of tissue slivers, depending on the desired slicing resolution and cutting blade thickness. With a thousand slivers, the resulting Z-stack file size can be as large as 6 TB.

A single microscopy image, or a Z-stack, provide only a static view of the tissue condition at a single point in time. Researchers and disease pathologists are often interested in how a given drug or treatment affects the tissue over time, and in how long a drug remains effective in the tissue before being cleared away by the body. To understand the dynamic behavior, multiple images are taken over time, and layered sequentially in time, like frames in a movie. The viewer can then use a conventional video player to watch the image sequence play out over time. Again the resulting file size of a time sequence data becomes very large, especially when captured at 30 viewing frames per second or higher, necessary for smooth observation of time sequence data by the human eye.

In the field of fluorescence microscopy, a specimen is illuminated by an excitation light of a specific wavelength, which causes fluorophores, either naturally existing in the specimen, or specifically introduced by means of binding to certain proteins, biological cell structures, or conjugated antibodies, to emit light, usually at a different wavelength, the emitted light captured by a microscope as an image.

Recent advances in modern multiplexed fluorescence microscopes can now employ a set of fluorophore dyes, each emitting a different wavelength, and each binding to a different cell structure or biological property, in order to visualize multiple attributes simultaneously. For example, one type of fluorescent dye may bind only a cell nucleus, while another dye may bind an outer cell membrane, and yet a third type of dye may be used to bind only cancer cells.

Since each dye uses a different wavelength, a multiplexed fluorescence microscope typically outputs a series of images, one for each dye, layered on top of each other (similar to Z-stack, except the vertical direction reflects different dyes). Fluorescence microscopy is routinely used for disease detection and prevention, and in clinical medicine and biomarker discovery. Commercial dyes, such as Alexa Flour series and Cy5 dyes, are readily available. The number of dyes in a given experiment can vary, up to 10 dyes or more. A confocal fluorescence microscope typically generates large files, comprised of multiple stacked images, about 3 GB each dye, for a total of up to 30 GB file size.

As the sizes of datasets increase, it is correspondingly difficult to manage (e.g., store transport and analyze) these larger datasets quickly and efficiently. Described herein are systems and methods that address these problems.

SUMMARY OF THE DISCLOSURE

The apparatuses and methods described herein address the need to store and transfer large quantities of data which is particularly acute when dealing with spectroscopic data. The traditional approach to the problem has been to apply some means of compression to the data in order to reduce the overall data size. The methods and apparatuses (e.g., systems) described herein provide high-fidelity image compression up to as much as 330-fold. These techniques may be applied to extremely large datasets, including multi-dimensional data sets such as multi-dimensional spectrometry (e.g., mass spectrometry), multi-dimensional imaging data sets, etc., The processed and compressed data sets may be restored at high fidelity which is nearly indistinguishable from the original data/images when viewed at high magnification (for example, up to 40× magnification for imaging datasets). The proposed methods may result in a substantial decrease in the cost of storing and transferring this type of data, and in a significantly faster processing time, including on-demand processing and viewing of images.

Existing compression methods are not very effective in dealing with large multi-dimensional spectroscopic data. As used herein, large datasets may include those having greater than 1 GB (e.g., greater than 10 GB, greater than 50 GB, greater than 100 GB, between 1-100 GB, etc.) in the uncompressed form. The methods and apparatuses described herein may prevent significant loss of fidelity from the original dataset, despite the high degree of compression achieved. Lossless compression methods such as BZIP2, LZW, and ZIP are commonly used, primarily because the original data can be fully restored, without any loss of information. However, the amount of compression that can be obtained with lossless compression is usually rather limited, typically less than 2 for spectroscopic data, and in some cases the resulting compressed file size may even expand to become larger than the original file, depending on the specific lossless compression method.

In many situations it is often acceptable to use lossy compression methods in systems that can tolerate a limited amount of loss. A lossy compression in this context refers to a compression method in which the restored data, after decompression, may not be exactly the same as the original data input to the compression. As long as the absolute difference between the restored and original data—that is, the restoration error—is small enough, the situation may be acceptable in some systems. However, once loss is allowed, it is often difficult to guarantee the accuracy of the result, due to the subjective nature of the errors. Lossy compression methods have been traditionally applied in situations where there is an inherent redundancy in the data, for example, in digital and cellphone camera image processing, where it is known the eye is unable to differentiate high frequency variations in local neighborhoods, and thus filtering out the high frequency content is desirable as a means for reducing the noise.

Many sensors and analyzers, including but not limited to radiation or x-ray detectors and spectrometers, accelerometers, mass spectrometers, microscopes and fluorescent microscopes, and histopathology imagers, collect and store data using binary and double precision floating point values, in order to retain the highest possible accuracy. Large data sets obtained using such sensors often do not include repeating patterns that can be recognized and effectively compressed utilizing existing conventional compression systems. There is a need for methods and systems capable of compressing large data sets comprised of double precision floating point numbers, and high-dynamic range, e.g., up to 64 bits-per-pixel, integer data that are otherwise not amenable to compression by existing conventional methods. Although the fundamental principle addressed by the methods and apparatuses described herein is the compression of data, the specific embodiments described and claimed herein may apply this broad principle in a specific manner that is tailored to the problems uniquely faced by large sets of sparse multidimensional ordered series data, and specifically large sets of spectroscopic data Individual data series from sparse multidimensional ordered series data may be compressed independently of the other data series. However, in many situations, including mass spectrometry and microscopy in particular, a high level of correlation may frequently exist among subsequent data series.

The methods and systems for compressing data (e.g., multidimensional time series data) described herein may have advantages over previously described compression methods, including the compressing of several data series together. By compressing more than one data series at a time, e.g., concurrently or sequentially, and using relationships (e.g., correlations) between the data in different data sets, the correlated portion(s) in a first or current data series can be predicted from one or more previously processed data series, and thereby the correlated portions may be eliminated by subtracting a predicted portion from the current series data. The advantage of this approach is in significantly reducing the amount of data that has to be encoded and transmitted for a current series data. This reduction in the amount of encoded information, for each correlated current series data, provides significantly higher compression.

During decompression, the correlated portion of a current data series can be generated from the previous data series in a similar manner, and automatically added to a current decompressed data series, to restore the original content. Therefore the correlated portion can be fully restored without requiring any additional bits in the encoded stream.

Compressing one or more data series together is not limited to compressing whole series data at a time. Each given series data can be divided into overlapping or non-overlapping local data regions, whereby a level of correlation may be computed between corresponding local regions of a current series data and one or more previous series data. In particular, these method and systems may identify (for use herein) a level of correlation between a current local region in current series data and the same local region in one or more previous series data. For example, a set of correlated local peaks in a current local region can be predicted from a set of corresponding peaks in local regions of one or more previous series data.

Any of these methods and systems for performing them may eliminate the correlated portion only when a significant level (e.g., a threshold level) of correlation exists between a local region of current series data and one or more previous series data. This may prevent or reduce the introduction of noise and rounding errors in the prediction and elimination steps, which are less reliable in weak correlation levels.

When correlation prediction is used in certain local regions and not in others, it may be helpful to introduce additional bits into the compressed stream, in order to direct the decoder, during decompression time, to apply correlation prediction restore or not, as the case may be, for each local region. The additional bits, e.g., per each local region, may increase the compressed file size and reduce the compression.

Also described herein are methods and systems for eliminating or reducing the need for such additional bits, per each local region, without compromising the compression. The level of correlation between a current series data and one or more previous series data may be computed and compared to a given threshold. If the correlation level in a current local region is equal to or exceeds the given threshold, a prediction algorithm may be applied, to predict the correlation level and subtract it from the current series data. Otherwise, if the calculated correlation level in a current local region is below the given threshold, no prediction is applied. The process may be repeated for each local region in turn, automatically detecting the presence of, and eliminating the correlated portion, in each local region, whenever a significant level of correlation exists, without introducing any additional bits into the compressed stream.

At decompression time, the level of correlation in each local region may again be computed from the restored data. If a correlation level in a current local region is equal or exceeds the given threshold, the correlated portion of a current data series can then be generated from the previous data series in a similar manner, and automatically be added to the current decompressed data series, to restore the original content. Therefore the correlated portion can be fully restored without requiring any additional bits in the encoded stream.

For example, these data compression methods and systems may be particularly useful for mass spectrometry (MS) data. Thus, in any of these variations, the data can include a multi-dimensional mass spectrometry series data, wherein the data comprises indexed data sets, each indexed data set comprising an index (n) representing the retention time index, a first variable ($x_n$) representing the mass over charge m/z at index n, and a second variable ($y_n$) representing the intensity or count of the number of ion fragments observed by the instrument.

In some variations the data can be multi-dimensional mass spectrometry series data, wherein the data comprise of indexed data sets, each indexed data set comprising an index (n) representing the retention time index, a first variable ($x_n$) representing the mass over charge m/z at index n, a second variable ($y_n$) representing the intensity or count of the number of ion fragments observed by the instrument, and a third variable ($z_n$) representing the observed ion mobility of the ions traveling through an ion mobility drift tube.

Any other type of multi-dimensional data, including in particular multi-dimensional imaging data may be processed by these methods and systems. For the example, in some variations the data can be multi-dimensional Bright-field microscopy image series data; the data may comprise indexed data sets, each indexed data set comprising an index (n) representing the pixel index within a given local region of the image, and a first variable ($x_n$) representing the pixel intensity captured by the microscope.

For example, the data can be multi-dimensional Bright-field microscopy image series data, the data comprise of indexed data sets, each indexed data set comprising an index (n) representing a pixel index within a given local region of the image, a first variable ($x_n$) representing the intensity of a first color component, a second variable ($y_n$) representing the intensity of a second color component, and a third variable ($z_n$) representing the intensity of a third color component of the image. It should be noted, without any loss of generality, that any number of variables may be used, for example, any number of color components, and the components can be any color components of a defined color space, such as, for example standard RGB or YCbCr luminance-chrominance representation.

In some variations the data can be multi-dimensional multiplexed fluorescence microscopy series data, wherein the data comprise of indexed data sets, each indexed data set comprising an index (n) the pixel index within a given local region of the image, a second index variable (k) representing a particular fluorescence dye layer, a first variable ($x_n$) representing the intensity of a first color component, a second variable ($y_n$) representing the intensity of a second color component, and a third variable ($z_n$) representing the intensity of a third color component of the image. As mentioned, any number of variables (e.g., dimensions) may be included and used, without any loss of generality. For example, with florescence microscopy data, the number of variables can be any number of color components, and the components can be any color components of a defined color space, such as standard RGB or YCbCr luminance-chrominance representation, for example.

For example, the data can be multi-dimensional multiplexed fluorescence microscopy series data, wherein the first, second, and third color components are full color images, the color of each image being a pseudo-color artificially assigned by the microscope operator in order to visualize complex cell or biomarker interactions by layering information from several multiple dyes on top of each other. For example, DAPI (4',6-diamidino-2-phenylindole) is a blue-fluorescent DNA stain which is commonly used as a nuclear counterstain in fluorescence microscopy, flow cytometry, and chromosome staining, while Alexa Four 546 is a bright yellow dye that can be optimized for various cellular labeling and detection. The observed fluorescence of each dye is represented as a monochrome image, whereby the microscope operator may typically assign a particular shade of blue color, selected from a palette of colors, for DAPI and a particular shade of yellow, again selected from a palette of colors, to Alexa Four 546, and so on, in order to simultaneously visualize the interaction of multiple dyes together, by assigning a specific color to each monochrome image, and layering the pseudo-colorized images on top of each other, to form a typical multiplexed fluorescence microscopy image.

The methods and apparatuses described herein may be used, for example, with indexed data sets, each index indexed data set comprising an index (n) representing the pixel index within a given local region of the image, whereby the entire series data is divided into N overlapping or non-overlapping local regions, wherein each local region comprised of a length of subsequent pixels, and the compression applied to each local region in turn.

In some variations the data comprises indexed data sets, each indexed data set comprising an index (n) representing the pixel index within a given local region of the image, whereby the entire series data is divided into N overlapping or non-overlapping local regions, wherein each local region comprised of a rectangular local neighborhood of a certain width and height, and the compression applied to each local region in turn.

The methods and apparatuses (e.g., systems) described herein may significantly compress sparse, multidimensional ordered series of data in a manner that has not previously been possible. For example, as compared to a standard file compression for mass spectrometry (MS) data, such as "ZIP" file compression, which may only provide about 2-3 fold reduction in file size, the compression methods described herein may result in 300 fold reduction in file size.

For convenience, the datasets described herein may be referred to as either prior motif compression (PM compression) or prior correlated region (PCR) compression.

For example, a computer-implemented method for compressing sparse multidimensional ordered series data may include: dividing a multidimensional ordered series data into a plurality of local regions, wherein the data in each local region comprise one or more indexed data sets, each indexed data set comprising an index (n) within a given local region of the image and one or more variables that are indexed by the index (n); identifying a predictor that calculates each of the one or more variables as a function of the index (n), a current local region data, and at least one previous local region data; adjusting the current local region data by subtracting a scaled predicted correlated data based on the at least one previous local region data when a level of correlation exceeding a threshold exists between the current local region data and the previous local region data; and encoding the adjusted current local region data, including an optimum scale factor, into a compressed stream.

The multidimensional ordered series data may be any type of data, particularly imaging and/or spectrographic data. The data may be divided into a plurality of overlapping local regions, or a plurality of non-overlapping local regions.

Any of these methods (or apparatuses for performing them) may compute the correlation level between the current local region and the previous local region. For example, for MS data, the correlation level may be computed from a series of similar peaks that exist between the current local region data and at least one previous local regions data. The series subset of similar peaks may be considered similar if the majority of peaks from the subset of similar peaks have one or more of: approximately a same mass-to-charge ratio, approximately a same charge state as determined from the spacing between subsequent peaks, and similar peak intensity abundance distributions that match an avergine model.

In general, the compressed stream may include the modified local region(s) as described above, along with the optimal scale factor (also referred to equivalently herein as an optimized scale factor or an optimum scale factor). The optimized scale factor may typically include one value per local region subset for a series of peaks (as opposed to an individual scale factor per peak value).

The previous local region (which may also be referred to herein as a prior local region or a template region) may be set by agreement between the encoder and decoder. In some variations the previous local region may be set to correspond to the previous local region in the scan order (for example, the region immediately to the left in raster-scan order). In another variation, the previous local region could be one of: (a) immediately left, (b) immediately above, or (c) immediately above and left (diagonal), as described herein. In some variations, the encoder may inspect all three, and may choose the one with the highest correlation level. The decoder may determine the previous local region from the data itself (e.g., it may inspect all three possible regions, after restoring the content) or it may be provided with the identity of the previous local region encoded within the compressed stream. In some variations the previous local region may be an average of (a), (b), and (c) above, etc. Thus, in general, the encoder and the decoder use the same referenced previous local region.

For example, the encoder and decoder may both be set to use as the previous local region a region that is immediately to the left of the current local region, as described in (a), above. This may provide a particular compression result. In some variations, the compression may be increased by choosing one (or a combination of) the prior local region(s) immediately to the left, above, and/or diagonal from the current local region, e.g., corresponding to (a), (b), or (c), above. In variations in which the encoder is looking at more than one (e.g., it may look at all three of these regions, a, b, and/or c) it may find a higher correlation in one of these regions as compared to others of these regions. As mentioned, in a given implementation, the encoder and decoder may be set to the same (e.g., fixed) method, e.g., always using one or more of these prior local regions (a, b, and/or c).

In some implementations, the header (e.g., one byte of the header) may be used to specify the particular prior local region(s) to be used, e.g., out of a predefined list of available methods, such as indicating the prior local region immediately to the left, immediately above, and/or immediately above and to the left (e.g., diagonal) from the current local region. Thus, the encoder (which may encode this header) may tell the decoder (which may read this header) which of the predefined prior local region(s) to use; for example, by sending a code in a particular header byte.

Also described herein are systems for compressing sparse multidimensional ordered series data. These systems may include a non-transitory computer-readable medium with instructions stored thereon, that when executed by a processor, cause the processor to perform any of the methods described herein. For example, the non-transitory computer-readable medium with instructions stored thereon may be configured to: divide a multidimensional ordered series data into a plurality of local regions, wherein the data in each local region comprise one or more indexed data sets, each indexed data set comprising an index (n) within a given local region of the image and one or more variables that are indexed by the index (n); identify a predictor that calculates each of the one or more variables as a function of the index (n), a current local region data, and at least one previous local region data; adjust the current local region data by subtracting a scaled predicted correlated data based on the at least one previous local region data when a level of correlation exceeding a threshold exists between the current local region data and the previous local region data; and encode the adjusted current local region data, including an optimum scale factor, into a compressed stream.

As mentioned, also described herein are methods of decompressing any of the compressed data (e.g., the sparse multidimensional ordered series data) described herein. For example, described herein are computer-implemented methods for decompressing sparse multidimensional ordered series data from a compressed data file or stream, the method comprising: receiving the compressed data file or stream; decoding an adjusted local region data from the compressed data file or stream, wherein the decoded adjusted local region data corresponds to a target local region to be restored; decoding a predictor scale factor from the compressed data file or stream by comparing the adjusted local region data to one or more prior local regions to generate a predicted local region peaks that are scaled by an optimum scale factor; adding the predicted local region peaks and the decoded adjusted local region data together to provide a restored local region data; and outputting the restored local region data.

For example, a computer-implemented method for decompressing sparse multidimensional ordered series data from a compressed data file or stream may include: receiving the compressed data file or stream; decoding an adjusted local region data from the compressed data file or stream, wherein the decoded adjusted local region data corresponds to a target local region to be restored; decoding a predictor scale factor from the compressed data file or stream by comparing the adjusted local region data to one or more prior local region data that are offset from the adjusted local region data to identify a subset of peaks from the adjusted local region data and scaling the subset of peaks by an optimum scale factor extracted from the compressed data file or stream to generate a predicted local region peaks; adding the predicted local region peaks and the decoded adjusted local region data together to generate a restored local region data; and outputting the restored local region data.

Also described herein are non-transitory computer-readable media with instructions stored thereon, that when executed by a processor, cause the processor to perform any of the computer-implemented methods described herein, and/or systems including these non-transitory computer-readable media.

In any of these methods and apparatuses (e.g., systems, media, etc.) may include adjusting the local region data and the predictor scale factor using a decoder that applies the encoding used to encode the data.

As mentioned, decoding the predictor scale factor may comprise comparing the adjusted local region data to one or more prior local regions that are offset from the adjusted local region data to identify a subset of peaks from the adjusted local region data and scaling the subset of peaks by the optimum scale factor to generate the predicted local region peaks.

In general, these methods and apparatuses may dynamically determine (using thresholding) when to add the predicted local region peaks and the decoded adjusted local region data together. For example, adding the predicted local region peaks and the decoded adjusted local region data together to provide the restored local region data comprises adding the predicted local region peaks and the decoded adjusted local region data together when a correlation between the adjusted local region data and one or more prior local regions exceeds a threshold level, otherwise setting the restored local region data to the decoded adjusted local region data. In some examples, adding the predicted local region peaks and the decoded adjusted local region data together comprises computing a correlation level between the adjusted local region data and one or more prior local regions and only adding the predicted local region peaks and the decoded adjusted local region data together when the correlation level exceeds a threshold, otherwise setting the restored local region data to the decoded adjusted local region data.

As with encoding, in general the decoding may be done continuously using a compressed data stream as the compressed data stream is received, or may be done after receiving, and in some cases storing, the compressed data file. Thus, in some examples, only a portion of the compressed data file or stream is restored. In some examples, receiving the compressed data file or stream comprises receiving a compressed data stream and processing as the stream is received (concurrently).

Further, any of these methods or apparatuses may be used for decoding a portion of a compressed data file or compressed data stream. For example, any of these methods or apparatuses may iteratively repeat the decoding, adding and outputting steps to restore the compressed data file or compressed data stream in its entirety.

Any of these methods may include retrieving the optimum scale factor from the compressed data file or stream. The optimum scale factor may be encoded in the compressed data file stream in a predetermined or marked location within the compressed data file or compressed data stream.

Any of these methods or apparatuses (e.g., systems) may include decoding and the adjusted local region data and adding the predicted local region peaks and decoded local region data in an order to process a plurality of current local regions sequentially.

BRIEF DESCRIPTION OF THE DRAWINGS

A better understanding of the features and advantages of the methods and apparatuses described herein will be obtained by reference to the following detailed description that sets forth illustrative embodiments, and the accompanying drawings of which:

In FIG. 2, the MS data shows a current local region data, showing a set of indexed series data each comprised of an index (n), a first variable ($x_n$) (in this example, the mass-to-charge ratio, m/z), and a second variable ($y_n$) (in this example, the intensity abundance count of ion fragments with the given m/z). The horizontal axis is mass-to-charge ratio, and vertical axis is the intensity ion fragment count.

FIG. 11A shows an image representing the entire dataset, while FIG. 11B shows an enlarged view of a sub-region (region "B") of the dataset.

FIG. 12A illustrates one example of an uncompressed multi-dimensional data set, corresponding to a multi-dimensional Bright-field microscopy image data.

FIGS. 12B-12C compare the quality of compression using the methods as described herein and traditional JPEG compression. FIG. 12B shows a magnified portion of the multi-dimensional Bright-field microscopy image data of FIG. 12A (region Z) that has been compressed and restored using the methods described herein. FIG. 12C shows a magnified image of the same region of FIG. 12A that has been compressed and restored using JPEG compression at a high compression ratio.

DETAILED DESCRIPTION

Described herein are computer-implemented methods for compressing sparse multidimensional ordered series data and specifically spectrographic data. These methods may generally include: receiving multidimensional ordered series data, wherein the data is divided in overlapping or non-overlapping local regions, the data in each local region comprise indexed data sets, each indexed data set comprising an index (n), representing an index within a given local region of the image, a first variable $(x_n)$, an optional second variable $(y_n)$, an optional third variable $(z_n)$, and optional additional variables (e.g., in case of multiplexed fluorescence microscopy); defining a predictor that calculates each first variable $(x_n)$, each additional variable (e.g., second $(y_n)$ and third variables $(z_n)$, etc.) in case of multiplexed fluorescence microscopy), as a function of the index (n) and at least one or more previous local region data; adjusting the current local region data by subtracting a scaled predicted correlated data based on a one or more previous local region data, when a high level of correlation exists between a current and previous local region data, larger than a predefined threshold; and (d) encoding the adjusted current local region data, including an optimum scale factor, into the compressed stream.

In general, the methods and apparatuses described herein are particularly well suited (though not limited to) sparse data sets having log density data distribution, such as MS data and histopathology imaging data, which may include relatively few pixels with high intensity change and many pixels with lower-intensity changes. The methods and apparatuses described herein may achieve high compression ratios without compromising the detail (e.g., imaging detail) of the data, including avoiding high-compression blocking artifacts, and/or quantization. These methods and apparatuses may be used with up to 64-bit dynamic range or greater. These methods and apparatuses may also be used for fast, e.g., on-the-fly (or regional) decompression, and may allow streaming of compressed images, including as the images are being taken.

Figure 1:
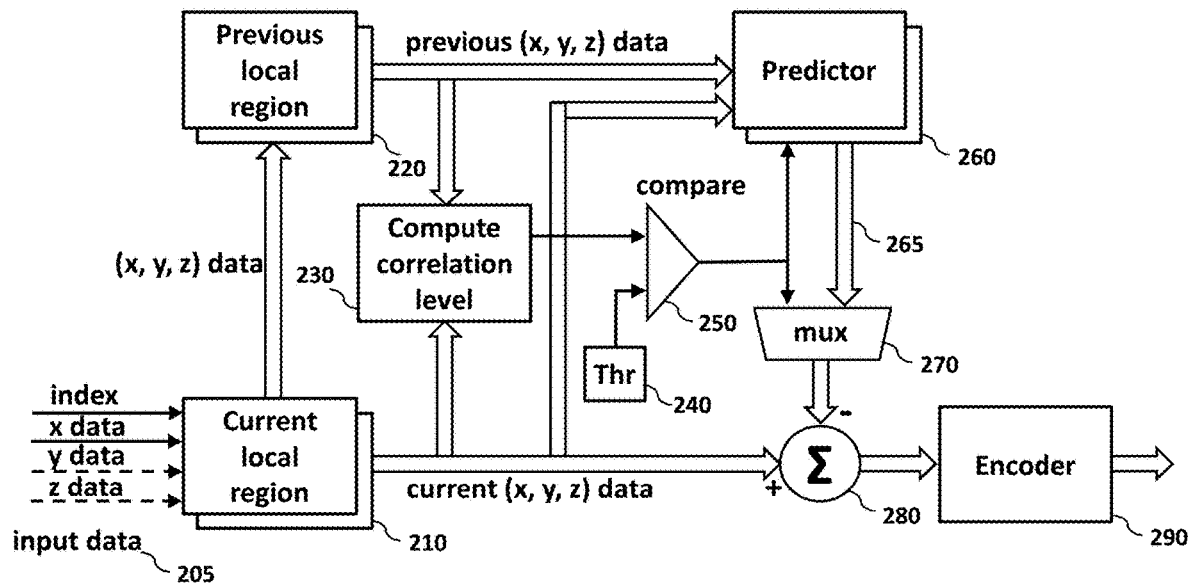
FIG. 1 shows one example of a block diagram illustrating one example of a multi-dimensional data compression method.

FIG. 1 shows a block diagram of one example of the compression method as described herein. The multi-dimensional input data 205 comprised of an ordered series data, wherein the data comprise of indexed data sets, each indexed data set comprising an index (n), at least one variable, a first variable, $(x_n)$; an optional second variables $(y_n)$; an optional third variables $(z_n)$; and so on. The number of optional variables may be determined by an input dimensionality.

In one example, the data consist of multi-dimensional mass spectrometry data, wherein the data comprise of indexed data sets, each indexed data set comprising an index (n), representing an index in a current local region, a first variable $(x_n)$ representing the observed mass-to-charge ratio m/z, and a second variable $(y_n)$ representing the observed intensity or count of ion fragment abundance observed by the instrument. In another example, the data consist of multi-dimensional mass spectrometry series data, wherein the data comprise of indexed data sets, each index indexed data set comprising an index (n), representing an index in a current local region, a first variable $(x_n)$ representing the observed mass-to-charge ratio m/z, a second variable $(y_n)$ representing the observed intensity or count of ion fragment abundance observed by the instrument, and a third variable $(z_n)$ representing the observed ion mobility of the ions traveling through an ion mobility drift tube.

In yet another example, the data consist of multi-dimensional Bright-field microscopy image data, or Whole Slide microscopy imaging data, in which the data comprises indexed data sets, each indexed data set comprising an index (n) of an image pixel within a current local region of the image, and a first variable $(x_n)$ representing the observed intensity of an image pixel captured by the microscope. In yet another example, the data consist of multi-dimensional Bright-field microscopy image series data, the data comprise of indexed data sets, each indexed data set comprising an index (n) of an image pixel within a current local region of the image, a first variable $(x_n)$ representing the intensity of a first color component, a second variable $(y_n)$ representing the intensity of a second color component, and a third variable $(z_n)$ representing the intensity of a third color component of the image. It should be noted, without any loss of generality, that the number of variables can be any number of color components, and the components can be any color components of a defined color space, such as standard RGB or YCbCr luminance-chrominance representation, for example.

In another example, the data consists of an image stack of monochrome microscopy image data, wherein the data comprised of indexed data sets, each indexed data set comprising an index (n) of an image pixel within a current local region of the image, and a set of variables $(x_n, y_n, z_n)$, whereby each variable represents the observed intensity of an image pixel at a particular image layer of the image stack. For example, a piece of tissue may be sliced into thin sections along a particular direction, about 1 to 5 micrometers apart. Each thin section is treated and processed separately, and the resulting images are stacked on top of each other as image layers, to provide visualization of the entire tissue. The common name of the technique is known as Z-stack.

In yet another example, the data consist of an image stack of color microscopy image data, wherein the data comprised of indexed data sets, each indexed data set comprising an index (n) of an image pixel within a current local region of the image, and a set of first, second and third variables $(x_n, y_n, z_n)$, whereby each first, second and third variable in the set represents an observed color intensity of image pixel at a particular image layer of an image stack, or Z-stack. It should be noted, without any loss of generality, that the number of variables can be any number of color components, and the components are the color components of a defined color space, such as standard RGB or YCbCr luminance-chrominance representation, for example.

In yet another example, the input data consist of a time sequence of a monochrome microscopy image data, wherein the data comprised of indexed data sets, each indexed data set comprising an index (n) of an image pixel within a current local region of the image, and a set of first variables ($x_n$, $y_n$, $z_n$, . . . ), wherein each variable represents the observed intensity of image pixel at a particular time point of the sequence. For example, a piece of tissue may be monitored for a level of drug uptake or absorbance over time. A sequence of microscopy images are taken over time, and the resulting images are layered sequentially in time, like frames in a movie. The viewer can then use a conventional video player to watch the image sequence play out over time.

In one example the input data consist of a time sequence of a color microscopy image data, wherein the data comprised of indexed data sets, each indexed data set comprising an index (n) of an image pixel within a current local region of the image, and a set of first, second and third variables ($x_n$, $y_n$, $z_n$), whereby each first, second and third variable in a set represents the observed of a first, second, and third color component intensity of image pixel at a particular time point of the sequence. It should be noted, without any loss of generality, that the number of variables can be any number of color components, and the components can be any color components of a defined color space, such as (for example) standard RGB or YCbCr luminance-chrominance representation.

In another example the data consist of a multiplexed multi-channel color fluorescent microscopy data, wherein the data comprised of indexed data sets, each indexed data set comprising an index (n), of an image pixel within a current local region of the image, and at least one or more variables ($x_n$, $y_n$, $z_n$, . . . ), whereby each variable represents the observed intensity of a particular fluorescent dye or stain at image pixel location. The number of variables reflects the number of different channels or dyes being used. Certain multiplexed fluorescence microscopy images may involve multiple dyes, up to ten or more, using a combination of special dyes and stains of different colors, each intended to identify the cell part boundaries, drug level concentration, internal biological state, or a positive biological marker.

In another example the data consist of multi-dimensional multiplexed fluorescence microscopy series data, wherein the data comprise of indexed data sets, each indexed data set comprising an index (n), of an image pixel within a current local region of the image, a second index variable (k) representing a particular fluorescence dye layer, a first variable ($x_n$) representing the intensity of a first color component, a second variable ($y_n$) representing the intensity of a second color component, and a third variable ($z_n$) representing the intensity of a third color component of the image. It should be noted, without any loss of generality, that the number of variables can be any number of color components, and the components can be any color components of a defined color space, such (for example) as standard RGB or YCbCr luminance-chrominance representation.

In yet another example the data consist of multi-dimensional multiplexed fluorescence microscopy series data, wherein the first, second, and third color components are full color images, the color of each image artificially selected by the microscope operator from a palette of colors, in order to visualize complex cell or biomarker interactions by layering information from several multiple dyes on top of each other. For example, DAPI (4',6-diamidino-2-phenylindole) is a blue fluorescent DNA stain, commonly used as a nuclear stain in fluorescence microscopy, flow cytometry, and chromosome staining, while Alexa Four 546 is a bright yellow dye that can be optimized for various cellular labeling and detection. The observed fluorescence of each dye is captured as a monochrome image, whereby the microscope operator may assign a particular color to each monochrome image, for example a particular blue color, selected from a palette of colors, for DAPI, and a particular yellow color, again selected from a palette of colors, to Alexa Four 546, and so on, in order to simultaneously view the combined interaction of multiple dyes, by assigning specific colors to each monochrome image, and layering the pseudo-colored images on top of each other, to form a typical multiplexed fluorescence microscopy image.

The data may consist of indexed data sets, each index indexed data set comprising an index (n) representing the pixel index within a given local region of the image, whereby the entire series data is divided into N overlapping or non-overlapping local regions, wherein each local region comprised of a length of subsequent pixels, and the compression applied to each local region in turn.

In some variations, the data may consist of indexed data sets, each index indexed data set comprising an index (n) representing the pixel index within a given local region of the image, whereby the entire series data is divided into N overlapping or non-overlapping local regions, wherein each local region comprised of a rectangular local neighborhood of a certain width and height, and the compression applied to each local region in turn.

The multi-dimensional input data may be divided into a set of N overlapping or non-overlapping local regions, which may be processed sequentially, in raster scan order, one local region at a time. The local regions may be defined in terms of a localized neighborhood of indexed data sets, such as a sequential group of indexed set, or a rectangular region of indexed set, all members of a local region being in close proximity of each other.

A block diagram of one example of the compression method described herein is shown in FIG. 1. FIG. 1 shows a block diagram that illustrates just one example of a proposed multi-dimensional data compression system confirmed to perform at least one variation of the methods described herein. In FIG. 1, a current local region of data 210, which may include indexed data sets, where each indexed data set comprises an index (n), a first variable ($x_n$), an optional additional variations (e.g., a second variable ($y_n$), and a third variable ($z_n$), etc.) is received from an instrument input data 205. The current local region 210 data may be the current piece of data to be encoded into the compressed stream.

When input data 205 comprise of a Z-stack or time-sequence data, the input data contains multiple layers of data, each layer corresponding to a particular tissue slice image layer in a Z-stack, or a particular time point image layer of a time sequence data. The double rectangle notation in FIG. 1 indicates the presence of multiple layers in the data.

Once the current local region data 210 has been processed and encoded, the local region data may be retained in a memory (e.g., in a circular buffer) for later use, e.g., as a previous local region data) and eventually discarded when no longer needed. The data of one or more previous local regions 220, closest in distance to the current local region 210, may be retrieved from the memory (e.g., circular buffer). This could be a corresponding local region data of one or more previous scans, having the same mass-to-charge ratio (first variable $x_n$) range as the current local region range. Or it could be an adjacent rectangular local region data, e.g., immediately to the left of a current local region, immediately above a current local region, or immediately above and to the left of a current region. All previous data may be held available in the memory (e.g., circular buffer), and can easily be accessed on a local region by local region basis.

This method may then compute the level of correlation 230 between a current local region data 210 and a previous one or more local region data 220, by comparing peak locations and intensities, looking for one or more series subsets of high intensity isotope patterns, each corresponding to a subset of almost uniformly spaced peaks, with an intensity distribution that follows a general avergine model, as disclosed in more detail below.

When more than one previous local region ("prior local region") is used, the data of several previous local regions may be averaged together, to improve the signal to noise ratio in case of noisy data. Alternatively, the level of correlation between each previous local region may be individually computed, to determine which of several previous local regions has the highest correlation with a current local region data, and this information then subsequently used to select one previous region with the highest correlation, or another metric, as the preferred previous local region to use.

For example, any of these methods or apparatuses may include, for each current local region, individually calculating the level of correlation for three previous local regions: (1) to the left of the current local region, (2) immediately above the current local region, and (3) immediately above and to the left of the current region. One of the three previous local regions, the one with the highest correlation to the current local region, may then be selected as the previous local region to use in all subsequent processing.

The computed level of correlation 230 between a current and previous local region data may be compared 250 to a pre-defined threshold 240. If the level of correlation 230 is higher or equal to the threshold 240, a predictor 260 is enabled. Otherwise, if the level of correlation 230 is lower than the threshold 240, the predictor 260 is not used, and multiplexer 270 output is forced to zero.

The predictor 260, when enabled, attempts to predict a correlated portion of a local region data based on the previous local region data. The correlated portion of the previous local region data is scaled with an optimum scale factor to match as close as possible the corresponding correlated portion of the current local region data.

For example, the correlated peaks of the previous local region data may each be scaled by the same factor. The predictor 260 output is passed through the multiplexer 270, the multiplexer enabled when the predictor is enabled, to the summing node 280. The optimum scaler value is also encoded into the compressed stream, one scale factor value per region.

When the computed level of correlation 230 is higher than or equal to the threshold 240, the current local region data is adjusted, by subtracting the predictor 260 output 265, through summing node 280, and the result is encoded into the compressed stream, instead of the original local region data. This adjustment essentially removes the correlated portion of the data, as best can be predicted from the previous local region data. Since the previous and current local regions are in close proximity of each other, they frequently contain similar data, which can be reliably predicted most of the time. After adjustment, only the residues of imperfect prediction remain in the data. The residues can be several orders of magnitude smaller than the original data.

A key advantage of the proposed method of the methods and apparatuses described herein over existing patents is that in existing techniques (see, e.g., U.S. Pat. Nos. 7,397,961, 8,023,750), each local region may be independently compressed. The correlated portion of each local region is therefore encoded over and over again, in each local region in turn. This consumes a lot of repeatable bits in the compressed stream. In contrast, the methods and apparatuses described herein encodes the correlated portion of the data only once, upon the first local region to be encountered. From this point forward, there is no need to send the correlated portion again, only the residue differences from predicted portions are encoded in the compressed stream. This provides a substantial reduction in the amount of information to be encoded per local region, thereby delivering superior compression results.

When the computed level of correlation 230 is lower than the threshold 240, the content of the previous local region may not be as similar to a current local region data, the quality of prediction may begin to deteriorate, and could in an extreme case result in adding noise and slight instability by injecting random predictions into a current local region data. To prevent from occurring, the comparator 250 output turns off the predictor, and disables any adjustment to a current local region data, by forcing the multiplexer 270 output to zero. The encoder then uses the original unmodified current local region data instead, as disclosed in existing patents. The encoder 290 may use any appropriate encoding, such as compression algorithms (either lossless or lossy) including PM or PCR compression as used with any other compression technique, e.g., wavelet compression, LZW compression, DCT compression, Huffman encoding, etc. One example of a form of compression is described in U.S. Pat. No. 9,385,751, herein incorporated by reference in its entirety.

As mentioned, the buffer may be a circular buffer. The circular buffer may be initialized to zero data at the beginning of the procedure. This may ensure that the computed correlation level 230 will be below the threshold 240, and the encoder will use the unmodified first few local regions data, until previous local region data becomes available (since for the first few current local regions no previous local regions data is yet available).

FIGS. 2-5 illustrates one example of a process of determining the level of correlation between a current local region series data and a previous local region data, and the use of a predictor to substantially reduce the amount of information in the encoded stream, in order to provide a significant improvement in compression, as disclosed herein. Although mass spectrometry data is used to illustrate the method in these examples, it should be understood that these techniques and apparatuses are not limited to these methods. Indeed, these methods may be used for other multidimensional ordered series data sets, as described herein.

Figure 2:
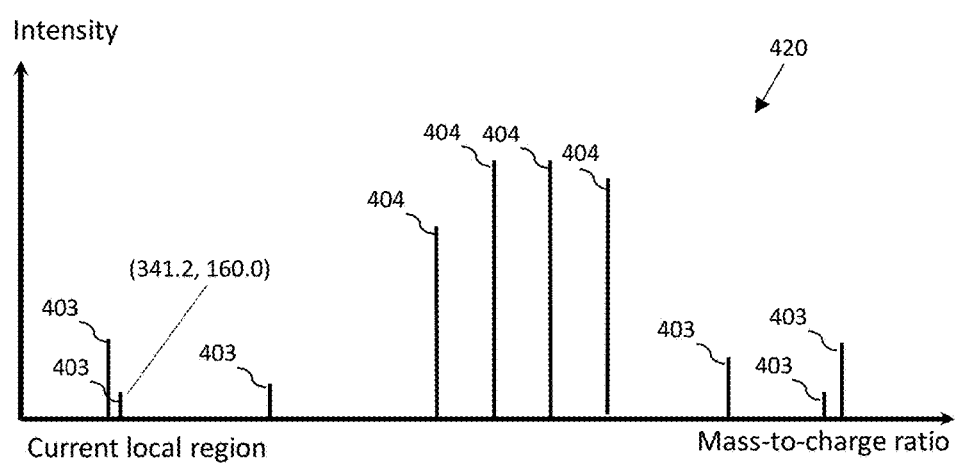
FIG. 2 illustrates one example of MS data that may be compressed using the methods described herein.

FIG. 2 shows just one example of a 'typical' current local region data of mass spectrometry data, showing a set of indexed series data 403 and 404, in which each indexed data is comprised of an index (n), a first variable ($x_n$) which in this example is a mass-to-charge ratio, m/z, and a second variable ($y_n$), which in this example is the intensity abundance count of ion fragments with the given m/z. The horizontal axis in FIG. 2 is a mass-to-charge ratio, and the vertical axis is the intensity ion fragment count.

As shown in FIG. 2, a plot 420 shows a typical ordered series data, recorded by a mass spectrometer. The recorded data represents a portion of one spectrum, of the relative intensity abundance of charged ions as a function of the mass to charge ratio (m/z). The horizontal axis in this figure is the mass-to-charge ratio (m/z), and the vertical axis shows the observed intensity values, or relative ion abundance. Other examples of ordered series data that may be compressed as described herein may include (but is not limited to) microscopy data, multiplexed fluorescence microscopy data, and any data where the horizontal axis is a time axis, or a wavelength or frequency axis, as the case may be.

In a typical mass spectrometry experiment, a sample (which may be solid, liquid, or gas), for instance a piece of cell tissue or a drop of blood, is vaporized by a stream of electrons or other means, such that the sample is ionized, and an electromagnetic field is applied to accelerate the charged ions and separate them according to their mass-to-charge ratio. Ions of the same mass-to-charge ratio will experience the same amount of deflection. Finally, the ions are detected by a detector that is capable of detecting charged particles. The results are usually displayed as spectra of the relative abundance of detected ions as a function of the mass-to-charge ratio. The molecular composition of the sample can then be identified from the characteristic fragmentation pattern, combined with the known elemental masses.

In each experiment, a mass spectrometer can produce many such spectra over time, resulting in a large quantity of data. A typical output in profile mode can readily exceed tens or even hundreds of GB of data from one single experiment (1 GB=1024×1024 Kbytes). A mass spectrometer can be used in genomics and proteomics for sequencing genes and amino acid peptide chains, and for determining the molecular composition of chemical compounds, as well as for identifying abnormal disease patterns such as altered glycosylation in cancer.

Each mass spectrometer scan is comprised of ordered series data, the data comprised of a series of peaks 403 and 404 of varying intensities at particular m/z locations. Each of the sequence of peaks in 420 is comprised of an (x, y) pair of double precision floating point numbers: the y-value is the observed intensity abundance, or the amplitude of a particular peak, and the x-value is the observed mass-to-charge ratio m/z. For example, the intensity abundance of the second peak is about 160.0, observed at a mass-to-charge ratio of about 341.2 m/z, as represented by the pair (341.2, 160.0) of double precision floating point numbers. The charged ions are trapped in an ion trap and released at particular times, at which point they travel under the influence of an electromagnetic field towards the detector, to be observed as a series of m/z and ion abundance values over time. Except for metadata and the experiment setup information, nearly all the data recorded is comprised of sequences of indexed paired double precision floating point numbers.

Each scan of the mass spectrometry data is comprised of a variable number of (x, y) double precision peaks, the instrument is usually programmed to record peaks in a given range of mass-to-charge values, between a given minimum and maximum m/z values of interest, for example between m/z=100 to m/z=5000 Dalton. The minimum and maximum m/z values usually remain static for all scans belonging to the same level spectra. Any peaks outside of the given mass-to-charge range, with m/z values lower than the minimum m/z value, or larger than the maximum m/z value, are discarded.

The entire scan range (for example, between m/z=100 to m/z=5000 Dalton) can then be divided into N overlapping or non-overlapping local regions, where each local region, representing a portion of a scan, is treated sequentially, one at a time. For example, the entire range of 100-5000 Daltons can be divided into seven non-overlapping local regions, having a range of 700 Daltons each. As mentioned above, the number (N) and/or sizes of these different overlapping or non-overlapping regions may be set in any appropriate manner, and may be based, e.g., on the size of the range, or a predetermine, user-defined and/or automatically or semi-automatically adjusting number and/or size. The plot 420 in FIG. 2 shows an example of data from a first local region of a given scan, with a range of mass-to-charge ratio between 100 to 800 Daltons.

In this example, the entire mass-to-charge ratio range of 100 to 5000 Dalton is comprised of 7 non-overlapping local regions, with a range span of 700 Dalton mass-to-charge ratio each. In practice, however, it may be desirable to have some overlap between subsequent local regions, whereby the span of each local region is extended by a certain amount on either side, for example by 100-150 Daltons on either side, anywhere from 5% up to 50% overlap. An overlap may provide smooth transitions between local regions without creating artifacts along local region borders. In addition, the overlap may be useful for eliminating limit cases, such as when a significant high-intensity peak happens to fall exactly on a local region boundary, where even a small rounding error may shift the position across to the other side of a local region border, hence it may not always be consistently included in a current region, which could introduce some instability into the prediction. Therefore it is often preferable to include some overlap, by extending the local region span on either side, in order to prevent instability and minor artifacts.

Figure 3:
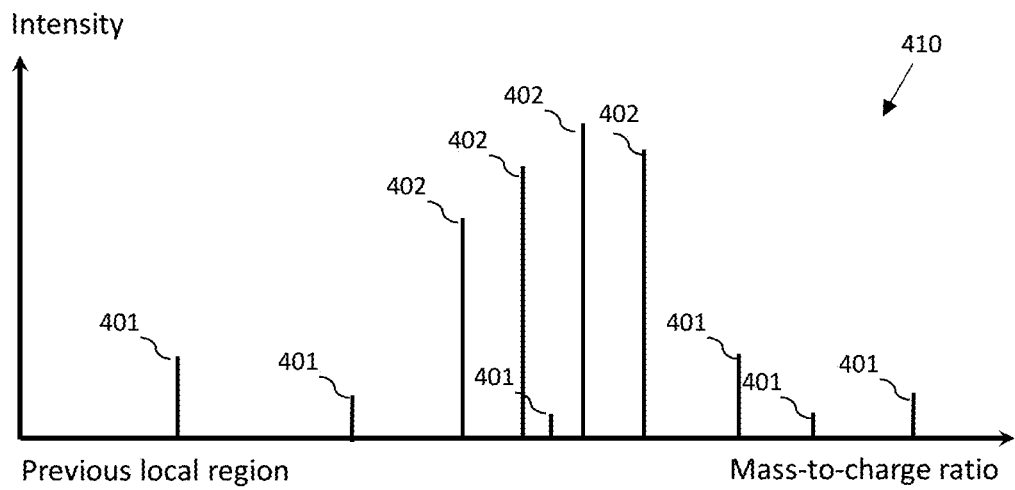
FIG. 3 shows an example of corresponding previous local region data, showing a set of indexed series data, each comprised of an index (n), a first variable ($x_n$) (mass-to-charge ratio, m/z), and a second variable ($y_n$) (intensity abundance count of ion fragments with the given m/z).

The plot 410 in FIG. 3 shows an example of a first local region data, with a range of mass-to-charge ratio of 100 to 800 Daltons, of a corresponding previous scan data, captured by the instrument at the most recent time before the current scan data. In FIG. 3, showing an example of a corresponding previous local region data, including a set of indexed series data 401 and 402, each indexed data comprises an index (n), a first variable ($x_n$) (mass-to-charge ratio m/z) and a second variable ($y_n$) (intensity abundance count of ion fragments with the given m/z). The horizontal axis is mass-to-charge ratio, and vertical axis is the intensity ion fragment count. Since the current scan and the previous scan are taken in close time proximity, the ion content is likely to be similar to a certain extent, and likely to have at least some similar peaks in common. The plot 410 data comprised of a series of peaks 401 and 402 of varying intensities at particular m/z locations.

Comparing the peaks FIGS. 2 and 3, one can readily recognize the series of 404 peaks in current local region of FIG. 2 being similar to the series of peaks 402 in previous local region FIG. 3. The peaks appear to have almost the same m/z location (within the instrument tolerance level, which can be highly accurate to 1 part-per-million in certain instruments), and similar intensities pattern, the intensity is typically less accurate than m/z. In addition, there are many peaks 403 in current local region 420, and other peaks 401 in previous local region 410, which clearly do not align. The probability of uncorrelated peaks falling by chance within 1 parts-per-million mass-to-charge ratio of each other is extremely small.

A further confirmation of correspondence between the series of peaks 402 and 404 may be obtained by the spacing and number of peaks in each peak series. For an isotope series, the spacing between subsequent peaks is almost constant, indicating the charge state of a molecule. The number of peaks and the intensity distribution of isotope peaks generally follows an avergine model, which is based on the elemental composition of the observed molecule. Hence the similarity of the series of the peaks 402 and 404, having the same overall mass, spacing, and intensity distribution pattern provides a strong indication of the same molecule being observed in both scans.

The level of correlation may be computed from the series of similar peaks that exist between the current and previous local regions. For example, peaks 402 and 404 are considered similar if the majority of peaks have one or more of: (1) almost the same mass-to-charge ratio m/z, within the instrument accuracy limits, (2) the same charge state as determined from nearly equal spacing between subsequent peaks, and (3) similar peak intensity abundance distributions that match the avergine model. In addition, each of the peaks under consideration must be of a significant intensity, sufficiently above the instrument signal-to-noise floor, to prevent false-triggering on random low-intensity noise peaks. The combination of these factors, together with a distinct isotope-resolved pattern, may provide a robust and highly reliable measure of the correlation level. In other systems, correlation may be based on similar features, such as intensity, wavelength, relative spacing/position, etc.

The resulting level of correlation between a current and one or more previous local regions may then be compared to a threshold. The threshold may be predetermined or calculated. If the level of correlation is larger than or equal the threshold, a predictor is used for adjusting the current local region data, based on the previous local region data, to reduce the amount of information, before encoding the current data. Otherwise, if the level of correlation is smaller than the threshold, no prediction is used, and the current local region data is directly encoded without adjustment, since low correlation levels may be indicative of weakly related peaks, which may not be as reliably predicted, and could potentially result in adding more noise and reducing the compression. The correlation level threshold is carefully chosen to ensure significant compression improvement when exceeding the threshold.

A predictor may be used to predict the current local region data, when the level of correlation meets or exceeds the threshold, from one or more corresponding previous local region data. The use of more than one corresponding previous local region data can improve the peak signal to noise ratio, by averaging the data, reduce fluctuations in peak intensities, and generally improve the prediction quality. However, this may come at the expense of requiring more memory to store multiple previous local region data of additional scans.

Figure 4:
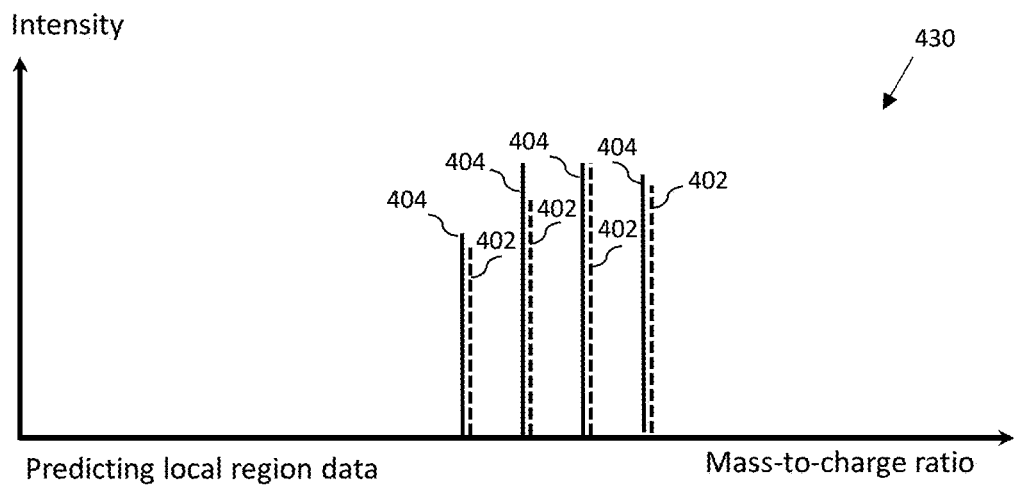
FIG. 4 shows an example of a set of correlated data between a current local region data from FIG. 2 and a particular previous local region data in FIG. 3. Only some of the data, some of the peaks in FIG. 2, correlate with some of the peaks in FIG. 3. Other peaks in FIGS. 2 and 3 are not correlated. In general, correlated peaks must have certain properties in common, such as: almost the same mass-to-charge ratio m/z value, within the instrument accuracy; almost equal spacing between subsequent peaks, confirming a certain charge state; and the observed intensity distribution should generally follow the averaging model. Note the data from FIG. 3 is drawn slightly shifted away relative to the data from FIG. 2 only for illustration purpose, in practice the peaks will fall almost on top of each other, within the instrument m/z accuracy of about 1 parts-per-million typical.

FIG. 4 illustrates one example of the method of predicting the correlated portion of a current local region from the previous local region data, shown in plot 430.

In FIG. 4, the illustration shows a set of correlated data between a current local region data 410 (e.g., as shown in FIG. 3) and previous local region data 420 (shown in FIG. 2). Only some of the data, such as the peaks 404 in FIG. 2, correlate with the peaks 402 in FIG. 3. The other uncorrelated peaks 403 and 401 in FIGS. 2 and 3 have been discarded. Correlated peaks must have certain properties in common, for example, in the MS data shown in FIGS. 2-4, correlated peaks show: (1) almost the same mass-to-charge ratio m/z value, within the instrument accuracy; (2) almost equal spacing between subsequent peaks, confirming a certain charge state; and (3) the observed intensity distribution should generally follow the avergine model. Note the data 402 is drawn slightly shifted away from 404 only for illustration purpose, in practice the peaks 402 will fall almost on top of 404, within the instrument m/z accuracy tolerance of 1 parts-per-million typical.

As shown in plot 430 in FIG. 4, only the peaks with high level of correlation 402 and 404 are retained from the previous and current local region data, respectively. All uncorrelated peaks 401 and 403 from either the previous FIG. 3 or current local region data FIG. 2 have been discarded. The predictor calculates the optimum scale factor to bring the correlated previous local region peaks as close as possible to match, i.e., predict, the set of correlated current local region peaks. Note that since individual peak intensities are not as accurate and generally deviate to some extent between scans, it is generally not possible to perfectly align all the highly-correlated peaks together.

In some variations the optimum scale factor may be chosen to: (1) match at least one of the highly-correlated peak intensities, while simultaneously (2) minimizing the sum of differences between all the other highly-correlated peak intensities, and (3) ensuring that each individual highly-correlated peak intensity difference must be greater or equal than zero. In some variations, the scale factor may be chosen to minimize the sum of differences between all the other highly-correlated peak intensities. In some variations the scale factor may be chosen to both minimize the sum of differences between all the other highly-correlated peak intensities and to ensure that each individual highly-correlated peak intensity difference must be greater or equal than zero.

The prediction according to one example is illustrated in FIG. 4 plot 430. As mentioned, only the highly-correlated peaks are shown. The current local region correlated peaks 404 are shown unscaled, in solid lines, exactly same as in FIG. 2. The predictor scales the previous highly-correlated local region peaks 402 (FIG. 3), shown in dotted lines, to match the current 404 peaks as close as possible. The optimum scale factor in this example is when the third 402 peak from left is scaled to the same height as the corresponding current third 404 peak intensity. The other 402 peaks, first, second and fourth from left are scaled by the same amount as the third peak, and in general are not likely to exactly match their corresponding 404 peak intensity. Note the 404 and 402 peaks in plot 430 are deliberately drawn side-by-side for illustration purpose, in practice they are likely to be extremely close to each other, within the instrument accuracy tolerance of about 1 parts-per-million.

It can be appreciated from plot 430 that the optimum threshold can be obtained by matching the intensities of the third peak from left in this example. Since all the other 402 intensities (e.g., the first, second and fourth peak from left) are lower than their corresponding 404 peak intensities, for each of the other scaled 402 peaks. This ensures that the individual difference between a 404 peak and corresponding scaled 402 peak is always greater than or equal than zero according to condition (3). If the procedure and/or apparatuses matches the intensity of any peak other than the third from left in this example, the third 402 peak would be scaled to become taller than its corresponding 404 peak, and at least the difference between the third 404 peak and corresponding scaled 402 peak would become negative, thereby voiding condition (3) in this method. Condition (3) is useful for ensuring that the prediction residue, after subtraction of the predicted intensity, will remain positive, since mass spec intensity data represents a positive ion-abundance count, which cannot typically be negative.

In another variation, in which the data is microscopy data using floating point representation, where data is allowed to be either positive or negative, a tighter optimum scale factor can be found by eliminating condition (1) and (3) above, and allowing the differences between individual 404 and corresponding scaled 402 peak intensities to assume either positive or negative values.

A predictor may thus utilize a single scale factor to predict a subset of highly correlated peaks in the current local region 404 based on the intensities of the correlated peaks 402 in a previous local region. The optimum scale factor may be encoded into the compressed stream, a single value for each local region, for use during decompression. The local region data is then adjusted by subtracting the predicted correlated peaks 402 from the current local data before encoding. An example of this result is shown in FIG. 5 plot 440.

Figure 5:
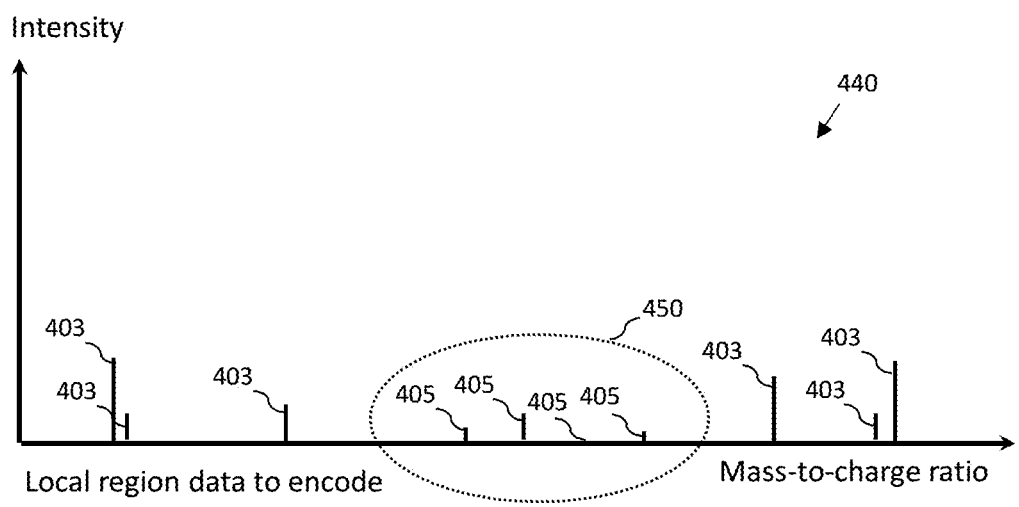
FIG. 5 shows an example of an adjusted current local region data, after subtraction of predicted correlated data in FIG. 4. The adjusted data comprised of residues (circled), after subtraction of predicted correlated previous peaks (FIG. 3) from original current local region peaks (FIG. 2) as shown in FIG. 4. The uncorrelated current local region peaks (on either side) are not adjusted. The result of the adjustment is the replacement of high-intensity peaks (as in FIG. 2) with much smaller residues 405, as highlighted by dotted line 450, and as can be seen by comparing FIGS. 2 and 5. The adjusted data is encoded into the compressed stream.

FIG. 5 shows an example of an adjusted current local region data, after subtraction of predicted correlated data 430 using the data shown in FIG. 4. The adjusted data comprised of residues 405, after subtraction of predicted correlated previous peaks 402 from original current local region peaks 404 as shown in FIG. 4. The uncorrelated current local region peaks 403 are not adjusted. The result of the adjustment is the replacement of high-intensity peaks 404 with much smaller residues 405, as highlighted by dotted line 450, and as can be seen by comparing FIGS. 2 and 5. The adjusted data may then be encoded into the compressed stream using any appropriate compression technique. See, e.g., U.S. Pat. No. 9,385,751, describing "PMI compression".

The local region data after subtraction may comprise the uncorrelated local region peaks 403 (FIG. 2) and residual intensities 405 of the correlated peaks remaining after subtracting the predicted intensities based on the previous local region data. The difference becomes evident by comparing the original local region data in plot 420 (FIG. 2) with the adjusted local region data in FIG. 5 plot 440. The group of tall high-intensity peaks 404 in FIG. 2 have been replaced by a considerably smaller group of intensity residues 405, as highlighted by the ellipse 450. The difference in intensity magnitude can be huge, up to several orders of magnitude in a typical mass spectrometry data. The resulting magnitude of the residues 405 intensities depends on the prediction accuracy, which can be quite good for a molecule being repeatedly scanned on the instrument, as is quite often the case with this type of data.

In this example, the prediction residues 405 are being encoded into the compressed stream, instead of the original high-intensity peaks 404. When the prediction is effective, the resulting intensities of the 405 peaks are very small, which leads to a significant improvement in compression.

During decompression, the previous local region data has already been restored before the current region data is being processed. An identical predictor may than used to scale the correlated peaks of the previous local region by the decoded scale factor, and add them back to the current local region data. The adjusted current local region data is then decompressed, to restore the adjusted current local region data comprised of 403 peaks and 405 residues. The scaled predicted peaks of the previous local region may then be added to the adjusted current local region data, to restore the original local region data 420 (e.g., as shown in FIG. 2).

If the level of correlation is weak, as indicated by being smaller than the given threshold, no prediction is used, and the local region data is encoded as is, without adjusting the data.

Figure 6:
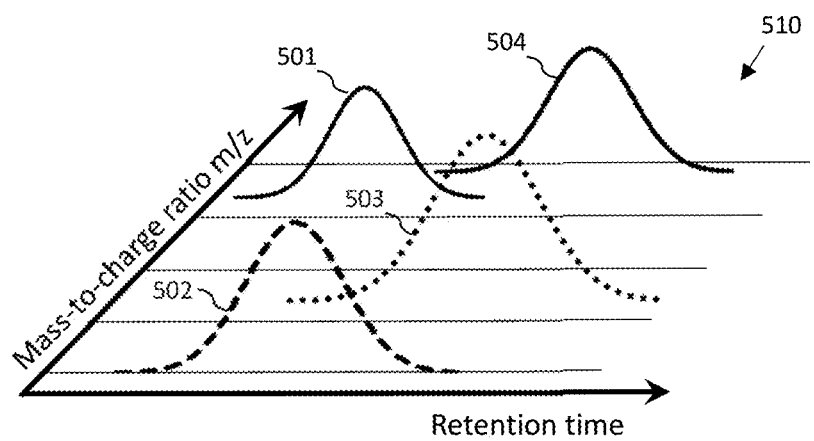
FIG. 6 shows one example of a three-dimensional (3D) elution profile of a typical mass spectrometry data over time. Each ion fragment exhibits a typical bell-shaped curve. The intensity of each curve is low at the beginning, then gradually rises to reach an apex, then gradually goes down to zero. The time duration and apex intensity height can vary based on the fragment composition. There may be some overlap between co-eluting ion fragments on rout to the detector.

FIG. 6 shows a three-dimensional elution profile of a typical mass spectrometry data over time. Each ion fragment exhibits a typical bell-shaped curve. The intensity is low at the beginning, then gradually rises to reach an apex, then gradually goes down to zero. The time duration and apex intensity height can vary based on the fragment composition. There may be some overlap between co-eluting ion fragments on rout to the detector.

Referring to FIG. 6, plot 510 illustrates a typical elution profile of ion fragments in a mass spectrometry instrument with liquid chromatography. The fragmented ions are held in an ion-trap and released in a certain order toward the detector according to their mass-to-charge ratio m/z. For example, ion fragments 501 are first to be released in time, followed by ion fragments 502, then 503, and finally 504 are last to be released in plot 510.

A typical elution profile of each ion fragment is an approximate Gaussian curve. The observed intensity is low at the beginning, then gradually increases as more molecules are being fragmented, reaching an apex at the center of the elution profile, and then dropping back down. The time duration and apex intensity of each molecule 501 through 504 can vary based on the composition of each molecule. The combined signal, as observed by the detector at any given point in time is shown in FIG. 7 plot 520.

Figure 7:
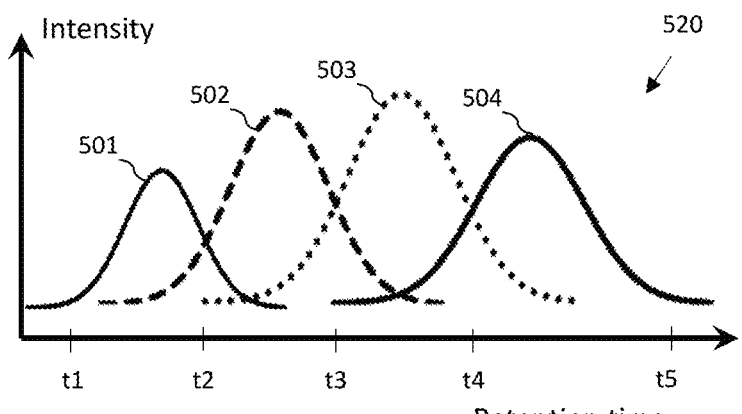
FIG. 7 shows the observed two-dimensional elution profile of the example "typical" mass spectrometry data in FIG. 6, after integration over the mass-to-charge ratio m/z axis, over time, also known as Total Ion Current (TIC). The total ion current is proportional to the elution profile envelope, the maximum of the individual curves at any given time. Since ions are electrically charged, a direct measurement of the detector current is proportional to the elution envelop. The minima points of the elution envelope define the cross-over transition time-points t2, t3, t4 from one ion fragment species to another.

FIG. 7 shows an observed two-dimensional elution profile of a typical mass spectrometry data such as that shown in FIG. 6, after integration over the mass-to-charge ratio m/z axis, over time, also known as Total Ion Current (TIC). The total ion current is proportional to the elution profile envelope, the maximum of the individual curves 501-504 at any given time. Since ions are electrically charged, a direct measurement of the detector current is typically proportional to the elution envelope. The minima points of the elution envelope define the cross-over transition time-points t2, t3, t4 from one ion fragment species to another.

As can be appreciated from FIG. 7 plot 520, one type of ion fragment is dominant for most of the time. The ion fragment 501 is dominant from t1 to t2. Initially, there is a pure concentration of only ion fragments 501, however, toward the end time t2 the amount of ion fragments 502 gradually increases until at time t2 it reaches an equal amount to ion fragments 501, wherein 501 no longer dominates. Ion fragments 502 dominate from time t2 to t3, and so on. Each ion group strongly dominates near the apex of the ion-group, and becoming more of a mixture spectra closer to the transition points, at times t1, t2, t3 and t4.

A typical mass spectrometer run takes one to two hours, while the typical elution duration of any particular ion fragment 501 to 504 may last from a few minutes up to 25 minutes or so, depending on the experiment and the particular material composition of the molecules of interest. Increasingly, mass spectrometry instruments can capture scans at high speed, higher than 100 scans per second without losing sensitivity or resolution. This means that subsequent scans are likely to be very similar throughout an instrument run for the most part, except for a few small intervals, during which the eluting ion-fragments transition from one type to another. The proposed methods and apparatuses described herein may successfully predict the correlated current local region data from the previous data with high accuracy, and achieve much higher compression than would otherwise be possible by compressing each scan independently. Thus, instead of spending many bits to encode the similar content of each subsequent scan over and over again, as would be the case with independent compression of each scan, the correlated portion may be compressed only once at the beginning, and in subsequent scans, only the residual changes, if any, together with uncorrelated peaks, are encoded into the compressed stream, leading to a significant increase in compression according to the methods and apparatuses described herein.

Any of the methods (including user interfaces) described herein may be implemented as software, hardware or firmware, and may be described as a non-transitory computer-readable storage medium storing a set of instructions capable of being executed by a processor (e.g., computer, tablet, smartphone, etc.), that when executed by the processor causes the processor to control perform any of the steps, including but not limited to: displaying, communicating with the user, analyzing, modifying parameters (including timing, frequency, intensity, etc.), determining, alerting, or the like.

EXAMPLES

Figure 8A:
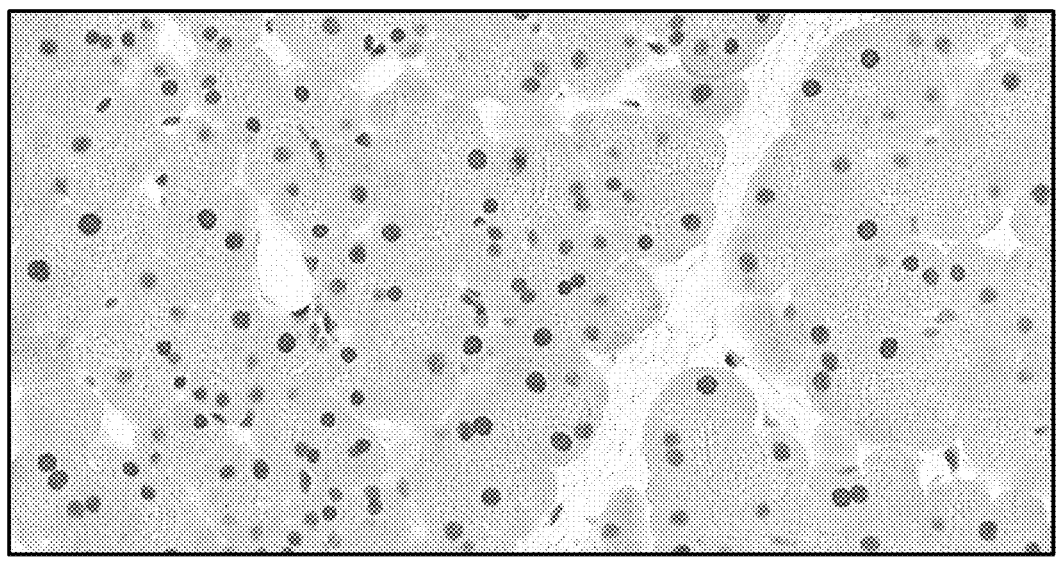
FIG. 8A illustrates one example of a small region of an image forming a histopathology data set shown unprocessed (having a very large file size, e.g., 1.764 GB).
Figure 8B:
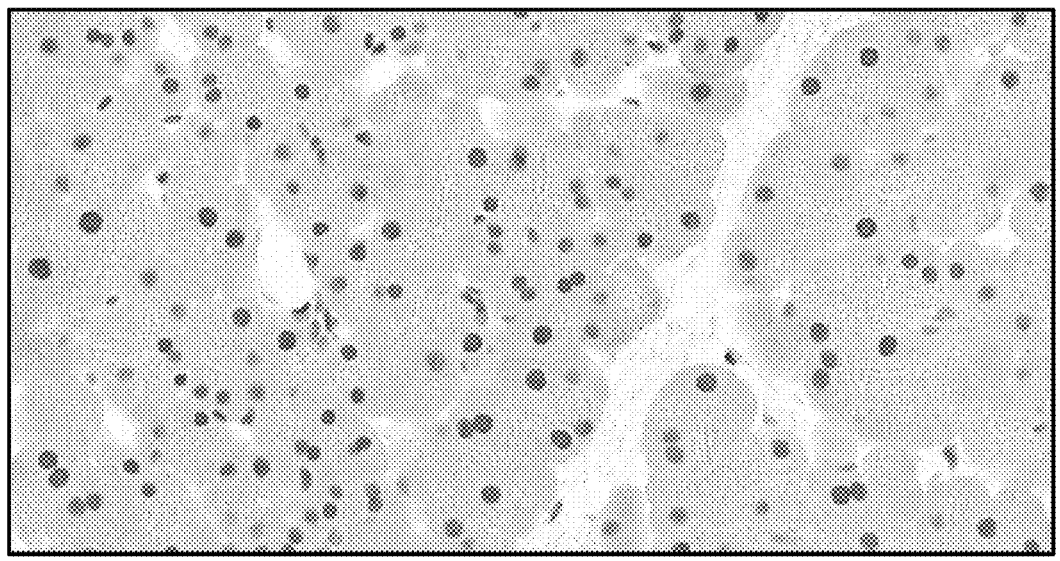
FIG. 8B illustrate the data set of FIG. 8A compressed and restored using the method described herein.

FIGS. 8A-8B illustrate one example of a side-by-side comparison of imaging (histopathology) data from un-compressed data (FIG. 8A) as compared to data compressed as described herein (FIG. 8B). In this example, a small portion of the image is shown at a magnification of 40× as compared to the originally captured image, to show the high fidelity of this technique. The two images are visually indistinguishable, even at this high magnification level. The original (FIG. 8A) file size is approximately 1764 MB (megabytes), and was compressed as described herein, to a compressed file size of, e.g., 15.9 MB (compression ratio of 111:1). For example, the original data may be compressed as described herein by first dividing the imaging dataset (which is a multidimensional ordered series data) into a plurality of local regions. In this example, the local regions may be sub-regions (e.g., square or rectangular sub-regions, though any two-dimensional shape may be used). These regions may be overlapping or non-overlapping. The imaging (e.g., pixel) data in each local region comprises at least one indexed data set, comprising an index (in this case, a spatial index, such as x, y index) may be used) within a given local region of the image and one or more variables that are indexed by the index (such as the pixel intensity, brightness, color, etc.).

Each local region may be processed in an order (e.g., a raster order, such as left to right, top to bottom, etc. or any other consistent order), to process a current local region, one local region at a time, as the data set is processed. As described herein, for each local region, the method/apparatus may identify a current local region, then identify and compare this current local region to a previous current local region (the initial or first few starting current local region(s) may be left unadjusted). For example, the previous current local region may be a region that corresponds an offset region that has already been processed, e.g., above and/or to the left of the current local region in an image dataset, when processing from left to right, top-to-bottom. If processing in a different order or pattern, the previous local region may be chosen from a different portion that has already been processed. In some variations more than one previous local region may be compared, or in a different order. For example, in some variations two or more previous local regions may be combined (e.g., averaged) or the like to improve the signal to noise ratio. The current local region may be compared to (one or more, or a combination of) previous local region(s) and a correlation level may be determined (e.g., computed) for this comparison. For example, the corresponding index region (e.g., x, y values) between different, and in some case partially overlapping) regions may be compared and a value (e.g., a correlation level) may be determined. The correlation level may be determined by comparing the intensity of each corresponding region (e.g., index, such as x, y positions) within the local regions. Where the values are highly correlated for the index values, in one or more variables, the correlation level may be increased by a set amount.

This computed correlation level may then be used to further process the data of the current local region. If, for example, this comparison/correlation level or value exceeds a threshold, which may be preset or adjustable, then a predictor may be identified and used to modify the current local region. A predictor may calculate each of the one or more variables as a function of the index, between a current local region data, and at least one previous local region data. For example, the predictor may be a scaled version of those regions (index values) of the current local region that have a sufficiently high level of correlation in a previous local region. The value at each index may be 0 (e.g., for regions that are not corresponding) or some scaled value of the corresponding indexed value from the previous local region (s). The scaled value may be scaled based on the entire local region, and may be scaled to a value that corresponds to a closest predicted value of one of the indexed peaks (e.g., pixel intensity, etc., in an image data set).

The current local region may be adjusted using this scaled predictor. For example, the current local region may be processed by adjusting the current local region data to subtract the scaled predicted correlated data based on the previous local region data when the level of correlation exceeds a threshold (e.g., between the current local region data and the previous local region data).

The modified (e.g., adjusted) current local region may then be encoded by an encoder, such as a PMI or PCR encoder, or by using standard ZIP or other compression encoder. The current local region data may be encoded along with the scaling factor and/or other data related to the predictor, into the compression stream.

Figure 9:
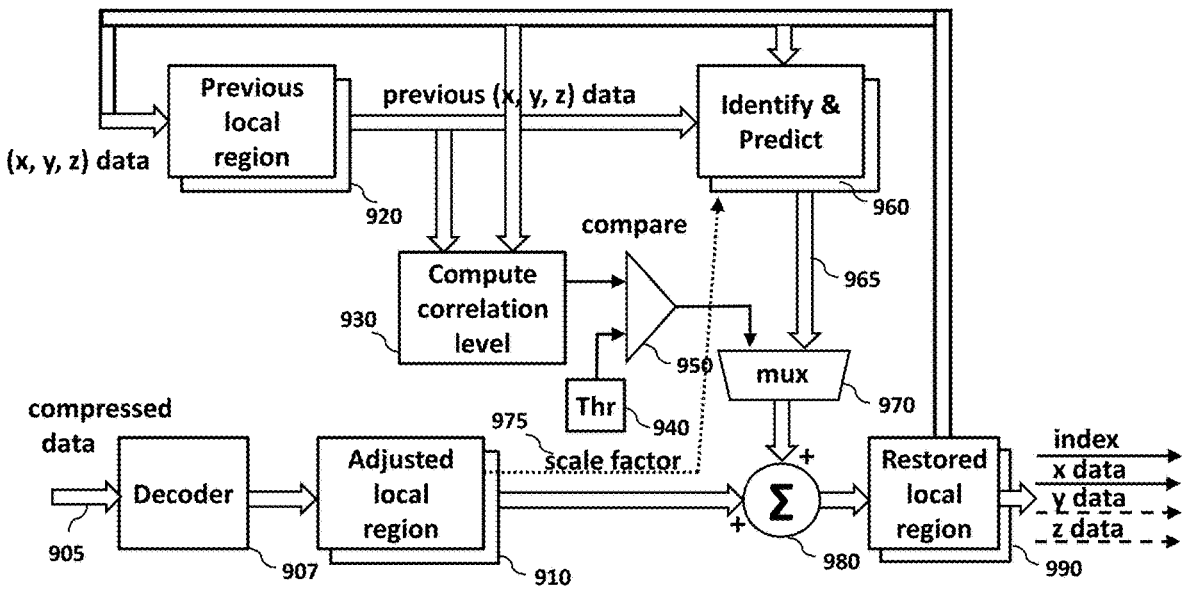
FIG. 9 schematically illustrates a block diagram of one example of a method of restoring (e.g., de-compressing) all or a portion of a multi-dimensional data set, as described herein.

The image may be uncompressed and restored (as shown in FIG. 8B) by decoding the compressed data, identifying (from the processed/compressed data) the local region(s) to be restored, identifying (from the processed/compressed data) the predictor used to modify the portion(s) of the data set, and adding back the scaled predictor to the local region to be restored to form the restored local region. FIG. 9 schematically illustrates one example of a method (and apparatus) for restoring all or a portion of a data set compressed as described herein.

In FIG. 9, the compressed data 905 may be decompressed by decoding the adjusted local region information 910 from the compressed input data, as well as the predictor data (e.g., scale factor 975 or predictor scale factor), from the compressed data. Both the adjusted local region to restore and the predictor data may be decoded using a decoder 907 that corresponds to the type of encoding used to encode the data (see FIG. 1). Thus, the decoder may provide a decoded current local region data 910 to be restored, and the decoded predictor scale factor 975 corresponding to this target local region to be restored. By reversing the procedure described for compressing in FIG. 1, the predictor and the decoded local region may then be added together 980 to provide the restored target ("restored local") region data 990, which may be output, displayed, saved, etc. This process may be iteratively used to decompress and restore an entire file, and/or it may be used just to restore a portion of a dataset.

For each local region in turn, the compressed data is decoded and applied to restore the adjusted local region data shown in FIG. 5. The optimum scale factor 975 is also retrieved from the compressed data. Each local region may be processed in an order (e.g., a raster order, such as left to right, top to bottom, etc. or any other consistent order), to process a current local region, one local region at a time, as the data set is processed. As described herein, for each local region, the method/apparatus may identify a current local region, then identify and compare this current local region to a previous (already processed) local region. For example, the previous local region may be a region that corresponds to an offset region that has already been processed, e.g., above and/or to the left of the current local region in an image dataset, when processing from left to right, top-to-bottom. If processing in a different order or pattern, the previous local region may be chosen from a different portion that has already been processed. In some variations more than one previous local region may be compared, or in a different order. For example, in some variations two or more previous local regions may be combined (e.g., averaged) or the like to improve the signal to noise ratio.

The current local region 910 may be compared to (one or more, or a combination of) previous local region(s) 920 to identify a subset of peaks which may have been adjusted as disclosed herein. The Identify & Predict module 960 searches the content of the local and previous region data, looking for a sequence of relatively high intensity candidate peaks in the previous region data (peaks 402 in FIG. 3) that match the residue peak m/z locations (peaks 405 in FIG. 5). The identification can be made with high confidence by taking advantage of the high m/z accuracy of the mass spec instrument, typically accurate down to 1 part-per-million tolerance. The identified peaks must match the residue locations, and the uniform spacing between subsequent peaks must match the corresponding charge state of the peaks in the previous local region data. In addition, the intensities of the peaks in the previous local region must match the expected avergine distribution as already disclosed herein.

Once an identification is made by the module 960, of a candidate sequence of peaks in the previous local region that matches the m/z residue locations in current adjusted region data, an identical predictor (to the one used during encoding) is applied for predicting the local region peaks based on the identified peaks in the previous local region data. Each of the identified peaks in the previous local region is scaled by the optimum scale factor, extracted and decoded from the compressed stream data. The scaled peaks 965 are shown in FIG. 9.

The predicted scaled sequence of peaks 965 is added to the adjusted local region data 910 through the multiplexer 970 and the summing node 980. By adding the predicted scaled peaks (predicted local region peaks, 402 in FIG. 4) to the adjusted local residues (adjusted local region data, peaks 405 in FIG. 5), the original local data (peaks 404 in FIG. 2) is effectively restored to the original local region values. The restored local region data is now available at the summing node output 990, and provided to the correlation level module 930 in order to verify the restored local region data is indeed correct and accurate.

The restored current local region data 990 may be compared to (one or more, or a combination of) previous local region(s) and a correlation level may be determined (e.g., computed) for this comparison. For example, the corresponding index region (e.g., x, y values) between different, and in some case partially overlapping) regions may be compared and a value (e.g., a correlation level) may be determined. The correlation level may be determined by comparing the intensity of each corresponding region (e.g., index, such as x, y positions) within the local regions. Where the values are highly correlated for the index values, in one or more variables, the correlation level may be increased by a set amount.

The computed correlation level may then be used to validate the data of the current local region. If, for example, this comparison/correlation level or value exceeds a threshold 940, which may be preset or adjustable, then a multiplexer 970 may be turned on to retain the current local region data. However, if the level of correlation between the current local region data and previous local region data is below the threshold 940, the multiplexer 970 is turned off, thereby disabling the scaled peak corrections from being added, and merely passing the adjusted local region data 910 uncorrected to the output 990. Hence the restored local region data at the decoder output 990 accurately reflects the original input to the encoder (by using the adjusted local region data based on the predicted peaks when the level of correlation exceeds the set threshold, or using the unadjusted local data when the level of correlation is below the threshold).

The local region data 990 is thus restored with high fidelity and made available for viewing or storing or for any subsequent downstream processing.

Figure 10:
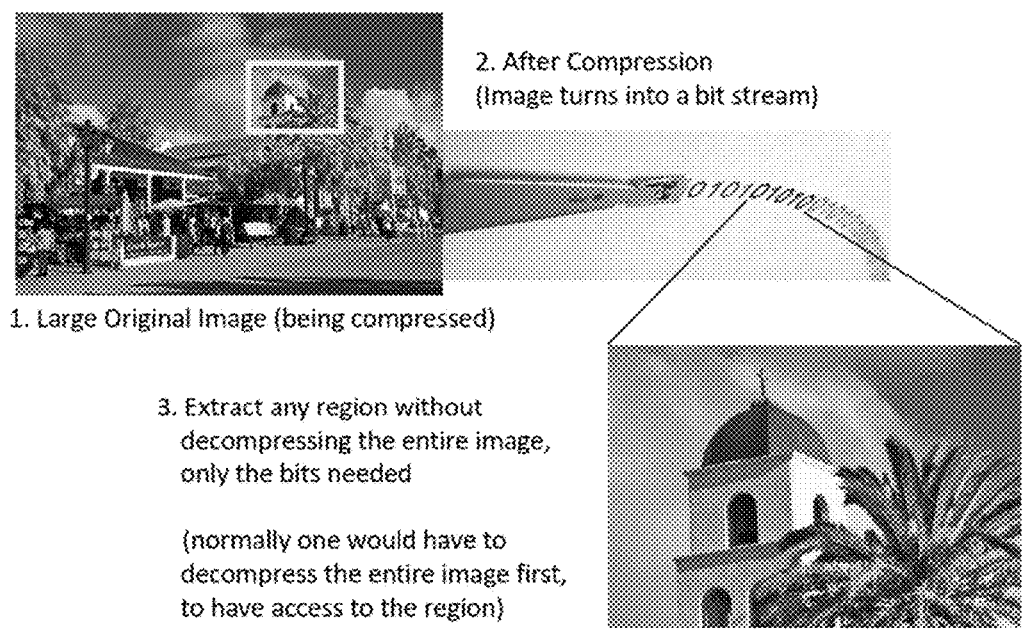
FIG. 10 illustrates the direct access of a portion of a multi-dimensional data set in the compressed stream using the methods and/or apparatuses described herein.

For example, FIG. 10 illustrates how the compression methods and apparatuses described herein may be used to provide direct (e.g., random) access from a compressed data stream. For example, in FIG. 10, a large data set (e.g., an image data, such as the large image shown) may be compressed and mapped into a data stream (compressed bit stream). Just a portion of this large data set may be analyzed or manipulated. For example, a region may be extracted without having to decompress the entire data set, allowing processing of only a particular one or more target region(s). This is in contrast to other compression techniques that require decompressing the entire dataset (e.g., image) to have access to a particular region. Only the local regions that comprise the portion of image of interest need to be restored, the rest of the image is not decompressed.

Figure 11A:
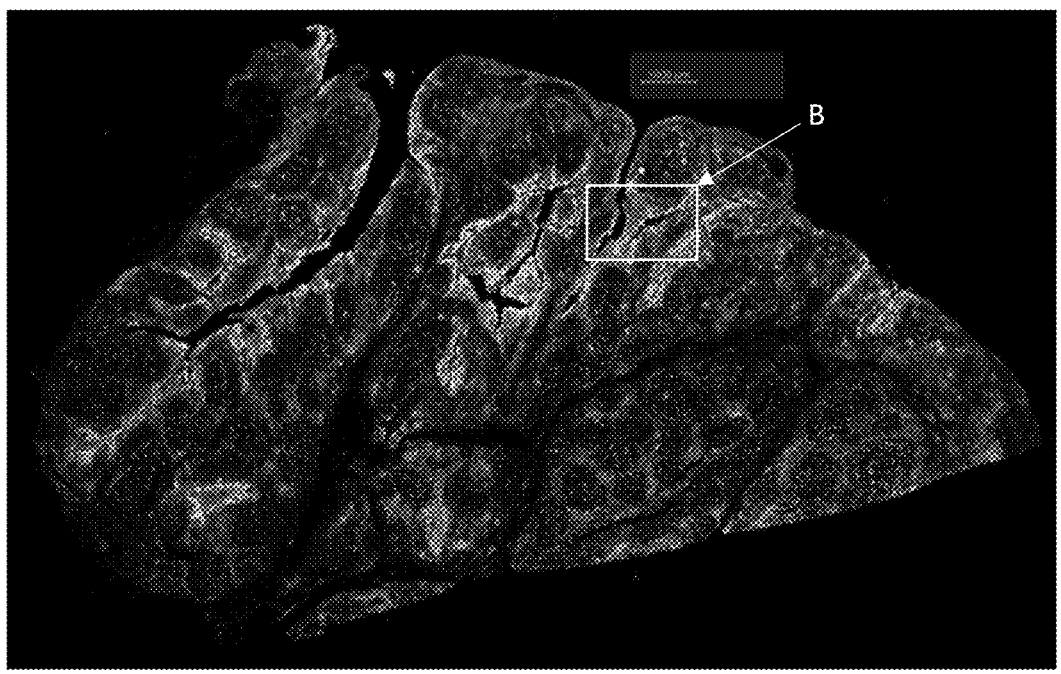
FIGS. 11A-11B show another example of a dataset that may be compressed as described herein.
Figure 11B:
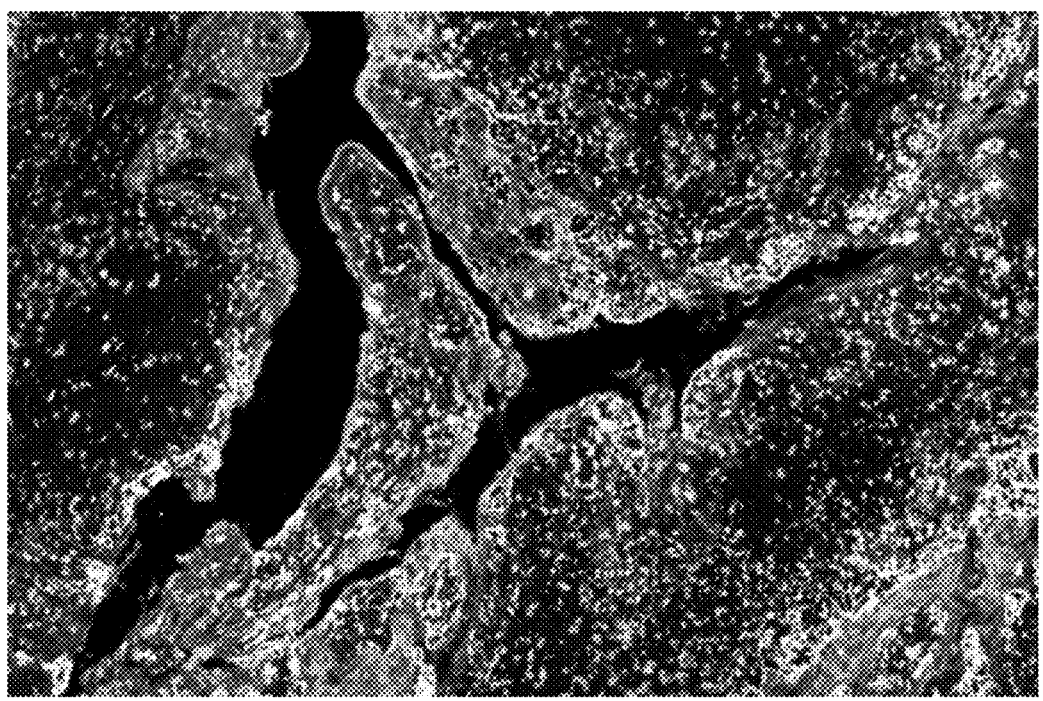

FIGS. 11A-11B illustrate another example of a dataset that may be compressed as described herein. In this example the data set is a multiplexed florescence dataset, showing five color staining (of five different biomarker dyes). The entire sparse multidimensional ordered series dataset may be compressed as described herein and regions may be decoded and examined, including magnifying de-compressed regions without significant loss of detail, from a zoom of 15% to 1600%. For example, in FIG. 11A, the boxed region B may be decompressed and magnified, as shown in FIG. 11B. FIG. 11B shows a magnification of 15% zoom. The original file size of the image in FIG. 11B is 321 MB; the methods described herein may be used to compress this dataset with a compression ratio of at least 39:1, providing a compressed file size of approximately 8.2 MB. The processed and uncompressed image region is indistinguishable from the original region. For example, the per pixel mean square error (PMSE) in this example is 4.24e-4, and the peak signal-to-noise ratio (PSNR) is approximately 56.25 dB. This compares very favorably to other commonly used compression techniques, such as JPEG (having a typical PSNR of about 45 dB at Q=90). On average, other image types had similar or better compression ratios at comparable quality; for example, data sets of images over 1 GB in size were compressed using the methods an apparatuses described herein to greater than 150:1 (e.g., from 1,628 MB to less than 14.4 GB, providing a ratio of about 154:1).

FIG. 12A illustrates another example of a large imaging dataset that may be advantageously compressed as described herein. The original image shown in FIG. 12A was compressed using a standard JPEG image compression technique at high compression and using the methods described herein (referred to PMI compression or PCR compression). Under magnification, the methods described herein introduced substantially less artifacts and loss than other known compression techniques, including JPEG. For example, a small region of the image of FIG. 12A was examined following compression and restoration using the methods described herein (shown in FIG. 12B) and are compared to the same region following compression and restoration using JPEG, shown in FIG. 12C. As can be seen by this comparison, the JPEG compression of FIG. 12C introduced a significant artifact not present when processed as described herein and shown in FIG. 12B.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Terminology used herein is for the purpose of describing particular embodiments only and is not intended to be limiting of the invention. For example, as used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items and may be abbreviated as "/".

Spatially relative terms, such as "under", "below", "lower", "over", "upper" and the like, may be used herein for ease of description to describe one element's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings of the methods and apparatuses described herein.

Throughout this specification and the claims which follow, unless the context requires otherwise, the word "comprise", and variations such as "comprises" and "comprising" means various components can be co-jointly employed in the methods and articles (e.g., compositions and apparatuses including device and methods). For example, the term "comprising" will be understood to imply the inclusion of any stated elements or steps but not the exclusion of any other elements or steps.

In general, any of the apparatuses and methods described herein should be understood to be inclusive, but all or a sub-set of the components and/or steps may alternatively be exclusive, and may be expressed as "consisting of" or alternatively "consisting essentially of" the various components, steps, sub-components or sub-steps.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical values given herein should also be understood to include about or approximately that value, unless the context indicates otherwise. For example, if the value "10" is disclosed, then "about 10" is also disclosed. Any numerical range recited herein is intended to include all sub-ranges subsumed therein. It is also understood that when a value is disclosed that "less than or equal to" the value, "greater than or equal to the value" and possible ranges between values are also disclosed, as appropriately understood by the skilled artisan. For example, if the value "X" is disclosed the "less than or equal to X" as well as "greater than or equal to X" (e.g., where X is a numerical value) is also disclosed. It is also understood that the throughout the application, data is provided in a number of different formats, and that this data, represents endpoints and starting points, and ranges for any combination of the data points. For example, if a particular data point "10" and a particular data point "15" are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

Although various illustrative embodiments are described above, any of a number of changes may be made to various embodiments without departing from the scope of the invention as described by the claims. For example, the order in which various described method steps are performed may often be changed in alternative embodiments, and in other alternative embodiments one or more method steps may be skipped altogether. Optional features of various device and system embodiments may be included in some embodiments and not in others. Therefore, the foregoing description is provided primarily for exemplary purposes and should not be interpreted to limit the scope of the invention as it is set forth in the claims.

The examples and illustrations included herein show, by way of illustration and not of limitation, specific embodiments in which the subject matter may be practiced. As mentioned, other embodiments may be utilized and derived there from, such that structural and logical substitutions and changes may be made without departing from the scope of this disclosure. Such embodiments of the inventive subject matter may be referred to herein individually or collectively by the term "invention" merely for convenience and without intending to voluntarily limit the scope of this application to any single invention or inventive concept, if more than one is, in fact, disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A computer-implemented method for decompressing sparse multidimensional ordered series data from a compressed data file or stream, the method comprising:
   receiving the compressed data file or stream;
   decoding an adjusted local region data from the compressed data file or stream, wherein the decoded adjusted local region data corresponds to a target local region to be restored;
   decoding an optimum scale factor from the compressed data file or stream by comparing the decoded adjusted local region data to one or more prior local regions decoded from the compressed data file or stream, and generating predicted local region peaks that are scaled by the optimum scale factor;
   adding the predicted local region peaks and the decoded adjusted local region data together to provide a restored local region data; and
   outputting the restored local region data.

2. The method of claim 1, wherein the adjusted local region data and the optimum scale factor are decoded using a decoder that applies encoding used to encode data.

3. The method of claim 1, wherein decoding the optimum scale factor comprises comparing the adjusted local region data to the one or more prior local regions that are offset from the adjusted local region data to identify a subset of peaks from the adjusted local region data and scaling the subset of peaks by the optimum scale factor to generate the predicted local region peaks.

4. The method of claim 1, wherein adding the predicted local region peaks and the decoded adjusted local region data together to provide the restored local region data comprises adding the predicted local region peaks and the decoded adjusted local region data together when a correlation between the adjusted local region data and the one or more prior local regions exceeds a threshold level, otherwise setting the restored local region data to the decoded adjusted local region data.

5. The method of claim 1, further comprising iteratively repeating the decoding, adding and outputting steps to restore the compressed data file in its entirety.

6. The method of claim 1, wherein only a portion of the compressed data file or stream is restored.

7. The method of claim 1, further comprising retrieving the optimum scale factor from the compressed data file or stream.

8. The method of claim 1, further comprising decoding and the adjusted local region data and adding the predicted local region peaks and decoded local region data in an order to process a plurality of current local regions sequentially.

9. The method of claim 1, wherein receiving the compressed data file or stream comprises receiving a compressed data stream.

10. A computer-implemented method for decompressing sparse multidimensional ordered series data from a compressed data file or stream, the method comprising:
   receiving the compressed data file or stream;
   decoding an adjusted local region data from the compressed data file or stream, wherein the decoded adjusted local region data corresponds to a target local region to be restored;
   decoding an optimum scale factor from the compressed data file or stream by comparing the decoded adjusted local region data to one or more prior local region data that are offset from the decoded adjusted local region data to identify a subset of peaks from the decoded adjusted local region data and scaling the subset of peaks by the decoded optimum scale factor extracted from the compressed data file or stream to generate a predicted local region peaks, wherein the one or more prior local region data is decoded from the compressed data file or stream;
   adding the predicted local region peaks and the decoded adjusted local region data together to generate a restored local region data; and
   outputting the restored local region data.

11. The method of claim 10, wherein adding the predicted local region peaks and the decoded adjusted local region data together comprises computing a correlation level between the adjusted local region data and one or more prior local regions and only adding the predicted local region peaks and the decoded adjusted local region data together when the correlation level exceeds a threshold, otherwise setting the restored local region data to the decoded adjusted local region data.

12. A system for decompressing sparse multidimensional ordered series data from a compressed data file or stream, the system comprising a non-transitory computer-readable medium with instructions stored thereon, that when executed by a processor, cause the processor to:
   receive the compressed data file or stream;

decode an adjusted local region data from the compressed data file or stream, wherein the decoded adjusted local region data corresponds to a target local region to be restored;

decode an optimum scale factor from the compressed data file or stream by comparing the decoded adjusted local region data to one or more prior local regions decoded from the compressed data file or stream, and generating predicted local region peaks that are scaled by the decoded optimum scale factor;

add the predicted local region peaks and the decoded adjusted local region data together to provide a restored local region data; and output the restored local region data.

13. The system of claim 12, wherein the adjusted local region data and the optimum scale factor are decoded using a decoder that applies encoding used to encode data.

14. The system of claim 12, wherein decoding the optimum scale factor comprises comparing the adjusted local region data to the one or more prior local regions that are offset from the adjusted local region data to identify a subset of peaks from the adjusted local region data and scaling the subset of peaks by the optimum scale factor to generate the predicted local region peaks.

15. The system of claim 12, wherein adding the predicted local region peaks and the decoded adjusted local region data together to provide the restored local region data comprises adding the predicted local region peaks and the decoded adjusted local region data together when a correlation between the adjusted local region data and the one or more prior local regions exceeds a threshold level, otherwise setting the restored local region data to the decoded adjusted local region data.

16. The system of claim 12, wherein the stored instructions are further configured to iteratively repeat the decoding, adding and outputting steps to restore the compressed data file in its entirety.

17. The system of claim 12, wherein only a portion of the compressed data file or stream is restored.

18. The system of claim 12 wherein the stored instructions are further configured to retrieve the optimum scale factor from the compressed data file or stream.

19. The system of claim 12, wherein the stored instructions are further configured to decode the adjusted local region data and add the predicted local region peaks and decoded local region data in an order to process a plurality of current local regions sequentially.

20. The system of claim 12, wherein receiving the compressed data file or stream comprises receiving a compressed data stream.

* * * * *

UNITED STATES PATENT AND TRADEMARK OFFICE
CERTIFICATE OF CORRECTION

| | | |
|---|---|---|
| PATENT NO. | : 11,790,559 B2 | Page 1 of 1 |
| APPLICATION NO. | : 17/694474 | |
| DATED | : October 17, 2023 | |
| INVENTOR(S) | : Doron Kletter | |

It is certified that error appears in the above-identified patent and that said Letters Patent is hereby corrected as shown below:

In the Claims

Claim 8, Column 30, Line 23; after "further comprising decoding" and before "the adjusted local region", delete "and"

Signed and Sealed this
Fifth Day of December, 2023

Katherine Kelly Vidal
*Director of the United States Patent and Trademark Office*